(12) United States Patent
Zhang et al.

(10) Patent No.: US 8,636,876 B2
(45) Date of Patent: Jan. 28, 2014

(54) DEPOSITION OF LICOO$_2$

(75) Inventors: Hongmei Zhang, San Jose, CA (US); Richard E. Demaray, Portola Valley, CA (US)

(73) Assignee: R. Ernest Demaray, Portola Valley, CA (US)

( * ) Notice: Subject to any disclaimer, the term of this patent is extended or adjusted under 35 U.S.C. 154(b) by 1770 days.

(21) Appl. No.: 11/297,057

(22) Filed: Dec. 7, 2005

(65) Prior Publication Data
US 2006/0134522 A1 Jun. 22, 2006

Related U.S. Application Data

(60) Provisional application No. 60/651,363, filed on Feb. 8, 2005, provisional application No. 60/634,818, filed on Dec. 8, 2004.

(51) Int. Cl.
*C23C 14/24* (2006.01)

(52) U.S. Cl.
USPC ............. 204/192.15; 204/192.12; 204/192.17

(58) Field of Classification Search
USPC ............. 204/192.12, 192.15, 192.22, 192.17
See application file for complete search history.

(56) References Cited

U.S. PATENT DOCUMENTS

| | | | |
|---|---|---|---|
| 712,316 A | 10/1902 | Loppe et al. | |
| 2,970,180 A | 1/1961 | Urry | |
| 3,309,302 A | 3/1967 | Heil | |
| 3,616,403 A | 10/1971 | Collins et al. | |
| 3,790,432 A | 2/1974 | Fletcher et al. | |
| 3,797,091 A | 3/1974 | Gavin | |
| 3,850,604 A | 11/1974 | Klein | |
| 3,939,008 A | 2/1976 | Longo et al. | |
| 4,006,070 A | 2/1977 | King et al. | |
| 4,082,569 A | 4/1978 | Evans, Jr. | |
| 4,099,091 A | 7/1978 | Yamazoe et al. | |
| 4,111,523 A | 9/1978 | Kaminow et al. | |
| 4,127,424 A | 11/1978 | Ullery, Jr. | |
| 4,226,924 A | 10/1980 | Kimura et al. | |
| 4,283,216 A | 8/1981 | Brereton | |

(Continued)

FOREIGN PATENT DOCUMENTS

| CN | 1415124 | 4/2003 |
|---|---|---|
| CN | 1471181 A | 1/2004 |

(Continued)

OTHER PUBLICATIONS

Machine Translation of JP 09-249962 to Arai et al. dated Sep. 22, 1997.*

(Continued)

*Primary Examiner* — Rodney McDonald
(74) *Attorney, Agent, or Firm* — Haynes and Boone, LLP

(57) ABSTRACT

In accordance with the present invention, deposition of LiCoO$_2$ layers in a pulsed-dc physical vapor deposition process is presented. Such a deposition can provide a low-temperature, high deposition rate deposition of a crystalline layer of LiCoO$_2$ with a desired <101> or <003> orientation. Some embodiments of the deposition address the need for high rate deposition of LiCoO$_2$ films, which can be utilized as the cathode layer in a solid state rechargeable Li battery. Embodiments of the process according to the present invention can eliminate the high temperature (>700° C.) anneal step that is conventionally needed to crystallize the LiCoO$_2$ layer.

17 Claims, 15 Drawing Sheets

(56) References Cited

U.S. PATENT DOCUMENTS

| | | |
|---|---|---|
| 4,318,938 A | 3/1982 | Barnett et al. |
| 4,437,966 A | 3/1984 | Hope et al. |
| 4,442,144 A | 4/1984 | Pipkin |
| 4,481,265 A | 11/1984 | Ezawa et al. |
| 4,518,661 A | 5/1985 | Rippere |
| 4,555,456 A | 11/1985 | Kanehori et al. |
| 4,572,873 A | 2/1986 | Kanehori et al. |
| 4,587,225 A | 5/1986 | Tsukuma et al. |
| 4,619,680 A | 10/1986 | Nourshargh et al. |
| 4,645,726 A | 2/1987 | Hiratani et al. |
| 4,664,993 A | 5/1987 | Sturgis et al. |
| 4,668,593 A | 5/1987 | Sammells |
| RE32,449 E | 6/1987 | Claussen |
| 4,672,586 A | 6/1987 | Shimohigashi et al. |
| 4,710,940 A | 12/1987 | Sipes, Jr. |
| 4,728,588 A | 3/1988 | Noding et al. |
| 4,740,431 A | 4/1988 | Little |
| 4,756,717 A | 7/1988 | Sturgis et al. |
| 4,785,459 A | 11/1988 | Baer |
| 4,812,712 A | 3/1989 | Ohnishi et al. |
| 4,826,743 A | 5/1989 | Nazri |
| 4,865,428 A | 9/1989 | Corrigan |
| 4,878,094 A | 10/1989 | Balkanski |
| 4,903,326 A | 2/1990 | Zakman et al. |
| 4,915,810 A | 4/1990 | Kestigian et al. |
| 4,964,877 A | 10/1990 | Keister et al. |
| 4,977,007 A | 12/1990 | Kondo et al. |
| 4,978,437 A | 12/1990 | Wirz |
| 5,006,737 A | 4/1991 | Fay |
| 5,019,467 A | 5/1991 | Fujiwara |
| 5,030,331 A | 7/1991 | Sato |
| 5,035,965 A | 7/1991 | Sangyoji et al. |
| 5,055,704 A | 10/1991 | Link et al. |
| 5,057,385 A | 10/1991 | Hope et al. |
| 5,085,904 A | 2/1992 | Deak et al. |
| 5,096,852 A | 3/1992 | Hobson |
| 5,100,821 A | 3/1992 | Fay |
| 5,107,538 A | 4/1992 | Benton et al. |
| 5,110,694 A | 5/1992 | Nagasubramanian et al. |
| 5,110,696 A | 5/1992 | Shokoohi et al. |
| 5,119,269 A | 6/1992 | Nakayama |
| 5,119,460 A | 6/1992 | Bruce et al. |
| 5,124,782 A | 6/1992 | Hundt et al. |
| 5,141,603 A | 8/1992 | Dickey et al. |
| 5,147,985 A | 9/1992 | DuBrucq |
| 5,153,710 A | 10/1992 | McCain |
| 5,169,408 A | 12/1992 | Biggerstaff et al. |
| 5,171,413 A | 12/1992 | Arntz et al. |
| 5,173,271 A | 12/1992 | Chen et al. |
| 5,174,876 A | 12/1992 | Buchal et al. |
| 5,180,645 A | 1/1993 | More |
| 5,187,564 A | 2/1993 | McCain |
| 5,196,041 A | 3/1993 | Tumminelli et al. |
| 5,196,374 A | 3/1993 | Hundt et al. |
| 5,200,029 A | 4/1993 | Bruce et al. |
| 5,202,201 A | 4/1993 | Meunier et al. |
| 5,206,925 A | 4/1993 | Nakazawa et al. |
| 5,208,121 A | 5/1993 | Yahnke et al. |
| 5,217,828 A | 6/1993 | Sangyoji et al. |
| 5,221,891 A | 6/1993 | Janda et al. |
| 5,225,288 A | 7/1993 | Beeson et al. |
| 5,227,264 A | 7/1993 | Duval et al. |
| 5,237,439 A | 8/1993 | Misono et al. |
| 5,252,194 A | 10/1993 | Demaray et al. |
| 5,273,608 A | 12/1993 | Nath |
| 5,287,427 A | 2/1994 | Atkins et al. |
| 5,296,089 A | 3/1994 | Chen et al. |
| 5,300,461 A | 4/1994 | Ting |
| 5,303,319 A | 4/1994 | Ford et al. |
| 5,306,569 A | 4/1994 | Hiraki |
| 5,307,240 A | 4/1994 | McMahon |
| 5,309,302 A | 5/1994 | Vollmann |
| 5,314,765 A | 5/1994 | Bates |
| 5,326,652 A | 7/1994 | Lake |
| 5,326,653 A | 7/1994 | Chang |
| 5,338,624 A | 8/1994 | Gruenstern et al. |
| 5,338,625 A | 8/1994 | Bates et al. |
| 5,342,709 A | 8/1994 | Yahnke et al. |
| 5,355,089 A | 10/1994 | Treger |
| 5,360,686 A | 11/1994 | Peled et al. |
| 5,362,579 A | 11/1994 | Rossoll et al. |
| 5,362,672 A | 11/1994 | Ohmi et al. |
| 5,381,262 A | 1/1995 | Arima et al. |
| 5,387,482 A | 2/1995 | Anani |
| 5,401,595 A | 3/1995 | Kagawa et al. |
| 5,403,680 A | 4/1995 | Otagawa et al. |
| 5,411,537 A | 5/1995 | Munshi et al. |
| 5,411,592 A | 5/1995 | Ovshinsky et al. |
| 5,419,982 A | 5/1995 | Tura et al. |
| 5,427,669 A | 6/1995 | Drummond |
| 5,435,826 A | 7/1995 | Sakakibara et al. |
| 5,437,692 A | 8/1995 | Dasgupta et al. |
| 5,445,856 A | 8/1995 | Chaloner-Gill |
| 5,445,906 A | 8/1995 | Hobson et al. |
| 5,448,110 A | 9/1995 | Tuttle et al. |
| 5,449,576 A | 9/1995 | Anani |
| 5,455,126 A | 10/1995 | Bates et al. |
| 5,457,569 A | 10/1995 | Liou et al. |
| 5,458,995 A | 10/1995 | Behl et al. |
| 5,464,706 A | 11/1995 | Dasgupta et al. |
| 5,470,396 A | 11/1995 | Mongon et al. |
| 5,472,795 A | 12/1995 | Atita |
| 5,475,528 A | 12/1995 | LaBorde |
| 5,478,456 A | 12/1995 | Humpal et al. |
| 5,483,613 A | 1/1996 | Bruce et al. |
| 5,493,177 A | 2/1996 | Muller et al. |
| 5,498,489 A | 3/1996 | Dasgupta et al. |
| 5,499,207 A | 3/1996 | Miki et al. |
| 5,501,918 A | 3/1996 | Gruenstern et al. |
| 5,504,041 A | 4/1996 | Summerfelt |
| 5,507,930 A | 4/1996 | Yamashita et al. |
| 5,512,147 A | 4/1996 | Bates et al. |
| 5,512,387 A | 4/1996 | Ovshinsky |
| 5,512,389 A | 4/1996 | Dasgupta et al. |
| 5,515,387 A | 5/1996 | Smith |
| 5,538,796 A | 7/1996 | Schaffer et al. |
| 5,540,742 A | 7/1996 | Sangyoji et al. |
| 5,547,780 A | 8/1996 | Kagawa et al. |
| 5,547,782 A | 8/1996 | Dasgupta et al. |
| 5,552,242 A | 9/1996 | Ovshinsky et al. |
| 5,555,127 A | 9/1996 | Abdelkader et al. |
| 5,561,004 A | 10/1996 | Bates et al. |
| 5,563,979 A | 10/1996 | Bruce et al. |
| 5,565,071 A | 10/1996 | Demaray et al. |
| 5,567,210 A | 10/1996 | Bates et al. |
| 5,569,520 A | 10/1996 | Bates |
| 5,582,935 A | 12/1996 | Dasgupta et al. |
| 5,591,520 A | 1/1997 | Migliorini et al. |
| 5,597,660 A | 1/1997 | Bates et al. |
| 5,597,661 A | 1/1997 | Takeuchi et al. |
| 5,599,355 A | 2/1997 | Nagasubramanian et al. |
| 5,601,952 A | 2/1997 | Dasgupta et al. |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates |
| 5,612,153 A | 3/1997 | Moulton et al. |
| 5,613,995 A | 3/1997 | Bhandarkar et al. |
| 5,616,933 A | 4/1997 | Li |
| 5,637,418 A | 6/1997 | Brown et al. |
| 5,643,480 A | 7/1997 | Gustavsson et al. |
| 5,644,207 A | 7/1997 | Lew et al. |
| 5,645,626 A | 7/1997 | Edlund et al. |
| 5,645,960 A | 7/1997 | Scrosati et al. |
| 5,654,054 A | 8/1997 | Tropsha et al. |
| 5,654,984 A | 8/1997 | Hershbarger et al. |
| 5,658,652 A | 8/1997 | Sellergren |
| 5,660,700 A * | 8/1997 | Shimizu et al. .......... 204/298.08 |
| 5,665,490 A | 9/1997 | Takeuchi et al. |
| 5,667,538 A | 9/1997 | Bailey |
| 5,677,784 A | 10/1997 | Harris |
| 5,679,980 A | 10/1997 | Summerfelt |
| 5,681,666 A | 10/1997 | Treger et al. |
| 5,681,671 A | 10/1997 | Orita et al. |

(56) References Cited

U.S. PATENT DOCUMENTS

| | | |
|---|---|---|
| 5,686,360 A | 11/1997 | Harvey, III et al. |
| 5,689,522 A | 11/1997 | Beach |
| 5,693,956 A | 12/1997 | Shi et al. |
| 5,702,829 A | 12/1997 | Paidassi et al. |
| 5,705,293 A | 1/1998 | Hobson |
| 5,718,813 A | 2/1998 | Drummond |
| 5,719,976 A | 2/1998 | Henry et al. |
| 5,721,067 A | 2/1998 | Jacobs et al. |
| RE35,746 E | 3/1998 | Lake |
| 5,731,661 A | 3/1998 | So et al. |
| 5,738,731 A | 4/1998 | Shindo et al. |
| 5,742,094 A | 4/1998 | Ting |
| 5,755,938 A | 5/1998 | Fukui et al. |
| 5,755,940 A | 5/1998 | Shindo |
| 5,757,126 A | 5/1998 | Harvey, III et al. |
| 5,761,234 A | 6/1998 | Craig et al. |
| 5,762,768 A | 6/1998 | Goy et al. |
| 5,763,058 A | 6/1998 | Isen et al. |
| 5,771,562 A | 6/1998 | Harvey, III et al. |
| 5,776,278 A | 7/1998 | Tuttle et al. |
| 5,779,839 A | 7/1998 | Tuttle et al. |
| 5,789,071 A | 8/1998 | Sproul et al. |
| 5,790,489 A | 8/1998 | O'Connor |
| 5,792,550 A | 8/1998 | Phillips et al. |
| 5,805,223 A | 9/1998 | Shikakura et al. |
| 5,811,177 A | 9/1998 | Shi et al. |
| 5,814,195 A | 9/1998 | Lehan et al. |
| 5,830,330 A | 11/1998 | Lantsman |
| 5,831,262 A | 11/1998 | Greywall et al. |
| 5,834,137 A | 11/1998 | Zhang et al. |
| 5,841,931 A | 11/1998 | Foresi et al. |
| 5,842,118 A | 11/1998 | Wood, Jr. |
| 5,845,990 A | 12/1998 | Hymer |
| 5,847,865 A | 12/1998 | Gopinath et al. |
| 5,849,163 A | 12/1998 | Ichikawa et al. |
| 5,851,896 A | 12/1998 | Summerfelt |
| 5,853,830 A | 12/1998 | McCaulley et al. |
| 5,855,744 A | 1/1999 | Halsey et al. |
| 5,856,705 A | 1/1999 | Ting |
| 5,864,182 A | 1/1999 | Matsuzaki |
| 5,865,860 A | 2/1999 | Delnick |
| 5,870,273 A | 2/1999 | Sogabe et al. |
| 5,874,184 A | 2/1999 | Takeuchi et al. |
| 5,882,721 A | 3/1999 | Delnick |
| 5,882,946 A | 3/1999 | Otani |
| 5,889,383 A | 3/1999 | Teich |
| 5,895,731 A | 4/1999 | Clingempeel |
| 5,897,522 A | 4/1999 | Nitzan |
| 5,900,057 A | 5/1999 | Buchal et al. |
| 5,909,346 A | 6/1999 | Malhotra et al. |
| 5,916,704 A | 6/1999 | Lewin et al. |
| 5,923,964 A | 7/1999 | Li |
| 5,930,046 A | 7/1999 | Solberg et al. |
| 5,930,584 A | 7/1999 | Sun et al. |
| 5,942,089 A | 8/1999 | Sproul et al. |
| 5,948,215 A | 9/1999 | Lantsman |
| 5,948,464 A | 9/1999 | Delnick |
| 5,948,562 A | 9/1999 | Fulcher et al. |
| 5,952,778 A | 9/1999 | Haskal et al. |
| 5,955,217 A | 9/1999 | Lerberghe |
| 5,961,672 A | 10/1999 | Skotheim et al. |
| 5,961,682 A | 10/1999 | Lee et al. |
| 5,966,491 A | 10/1999 | DiGiovanni |
| 5,970,393 A | 10/1999 | Khorrami et al. |
| 5,972,516 A | 10/1999 | Kaneko et al. |
| 5,973,913 A | 10/1999 | McEwen et al. |
| 5,977,582 A | 11/1999 | Fleming et al. |
| 5,982,144 A | 11/1999 | Johnson et al. |
| 5,985,485 A | 11/1999 | Ovshinsky et al. |
| 6,000,603 A | 12/1999 | Koskenmaki et al. |
| 6,001,224 A | 12/1999 | Drummond et al. |
| 6,004,660 A | 12/1999 | Topolski et al. |
| 6,007,945 A | 12/1999 | Jacobs et al. |
| 6,013,949 A | 1/2000 | Tuttle |
| 6,019,284 A | 2/2000 | Freeman et al. |
| 6,023,610 A | 2/2000 | Wood, Jr. |
| 6,024,844 A | 2/2000 | Drummond et al. |
| 6,025,094 A | 2/2000 | Visco et al. |
| 6,028,990 A | 2/2000 | Shahani et al. |
| 6,030,421 A | 2/2000 | Gauthier et al. |
| 6,042,965 A | 3/2000 | Nestler et al. |
| 6,045,626 A | 4/2000 | Yano et al. |
| 6,045,652 A | 4/2000 | Tuttle et al. |
| 6,045,942 A | 4/2000 | Miekka et al. |
| 6,046,081 A | 4/2000 | Kuo |
| 6,048,372 A | 4/2000 | Mangahara et al. |
| 6,051,114 A | 4/2000 | Yao et al. |
| 6,051,296 A | 4/2000 | McCaulley et al. |
| 6,052,397 A | 4/2000 | Jeon et al. |
| 6,057,557 A | 5/2000 | Ichikawa |
| 6,058,233 A | 5/2000 | Dragone |
| 6,071,323 A | 6/2000 | Kawaguchi |
| 6,075,973 A | 6/2000 | Greeff et al. |
| 6,077,106 A | 6/2000 | Mish |
| 6,077,642 A | 6/2000 | Ogata et al. |
| 6,078,791 A | 6/2000 | Tuttle et al. |
| 6,080,508 A | 6/2000 | Dasgupta et al. |
| 6,080,643 A | 6/2000 | Noguchi et al. |
| 6,093,944 A | 7/2000 | VanDover |
| 6,094,292 A | 7/2000 | Goldner et al. |
| 6,096,569 A | 8/2000 | Matsuno et al. |
| 6,100,108 A | 8/2000 | Mizuno et al. |
| 6,106,933 A | 8/2000 | Nagai et al. |
| 6,110,531 A | 8/2000 | Paz De Araujo |
| 6,113,749 A | 9/2000 | Kok et al. |
| 6,115,616 A | 9/2000 | Halperin et al. |
| 6,117,279 A | 9/2000 | Smolanoff et al. |
| 6,118,426 A | 9/2000 | Albert et al. |
| 6,120,890 A | 9/2000 | Chen et al. |
| 6,129,277 A | 10/2000 | Grant et al. |
| 6,133,670 A | 10/2000 | Rodgers et al. |
| 6,137,671 A | 10/2000 | Staffiere |
| 6,144,916 A | 11/2000 | Wood, Jr. et al. |
| 6,146,225 A | 11/2000 | Sheats et al. |
| 6,148,503 A | 11/2000 | Delnick et al. |
| 6,157,765 A | 12/2000 | Bruce et al. |
| 6,159,635 A | 12/2000 | Dasgupta et al. |
| 6,160,373 A | 12/2000 | Dunn et al. |
| 6,162,709 A | 12/2000 | Raoux et al. |
| 6,165,566 A | 12/2000 | Tropsha |
| 6,168,884 B1 | 1/2001 | Neudecker et al. |
| 6,169,474 B1 | 1/2001 | Greeff et al. |
| 6,175,075 B1 | 1/2001 | Shiotsuka et al. |
| 6,176,986 B1 | 1/2001 | Watanabe et al. |
| 6,181,283 B1 | 1/2001 | Johnson et al. |
| 6,192,222 B1 | 2/2001 | Greeff et al. |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,210,545 B1 | 4/2001 | Farooq et al. |
| 6,210,832 B1 | 4/2001 | Visco et al. |
| 6,214,061 B1 | 4/2001 | Visco et al. |
| 6,214,660 B1 | 4/2001 | Uemoto et al. |
| 6,218,049 B1 | 4/2001 | Bates et al. |
| 6,220,516 B1 | 4/2001 | Tuttle et al. |
| 6,223,317 B1 | 4/2001 | Pax et al. |
| 6,228,532 B1 | 5/2001 | Tsuji et al. |
| 6,229,987 B1 | 5/2001 | Greeff et al. |
| 6,232,242 B1 | 5/2001 | Hata et al. |
| 6,235,432 B1 | 5/2001 | Kono et al. |
| 6,236,793 B1 | 5/2001 | Lawrence et al. |
| 6,242,129 B1 | 6/2001 | Johnson |
| 6,242,132 B1 | 6/2001 | Neudecker et al. |
| 6,248,291 B1 | 6/2001 | Nakagama et al. |
| 6,248,481 B1 | 6/2001 | Visco et al. |
| 6,248,640 B1 | 6/2001 | Nam |
| 6,249,222 B1 | 6/2001 | Gehlot |
| 6,252,564 B1 | 6/2001 | Albert et al. |
| 6,258,252 B1 | 7/2001 | Miyasaka et al. |
| 6,261,917 B1 | 7/2001 | Quek et al. |
| 6,264,709 B1 | 7/2001 | Yoon et al. |
| 6,265,652 B1 | 7/2001 | Kurata et al. |
| 6,268,695 B1 | 7/2001 | Affinito |

(56) References Cited

U.S. PATENT DOCUMENTS

| | | |
|---|---|---|
| 6,271,053 B1 | 8/2001 | Kondo |
| 6,271,793 B1 | 8/2001 | Brady et al. |
| 6,271,801 B2 | 8/2001 | Tuttle et al. |
| 6,280,585 B1 | 8/2001 | Obinata et al. |
| 6,280,875 B1 | 8/2001 | Kwak et al. |
| 6,281,142 B1 | 8/2001 | Basceri et al. |
| 6,284,406 B1 | 9/2001 | Xing et al. |
| 6,287,986 B1 | 9/2001 | Mihara |
| 6,289,209 B1 | 9/2001 | Wood, Jr. |
| 6,290,821 B1 | 9/2001 | McLeod |
| 6,290,822 B1 | 9/2001 | Fleming et al. |
| 6,291,098 B1 | 9/2001 | Shibuya et al. |
| 6,293,688 B1 | 9/2001 | Deacon |
| 6,294,722 B1 | 9/2001 | Kondo et al. |
| 6,296,741 B1 | 10/2001 | Pinarbasi |
| 6,296,949 B1 | 10/2001 | Bergstresser et al. |
| 6,296,967 B1 | 10/2001 | Jacobs et al. |
| 6,296,971 B1 | 10/2001 | Hara |
| 6,300,215 B1 | 10/2001 | Shin |
| 6,302,939 B1 | 10/2001 | Rabin et al. |
| 6,306,265 B1 | 10/2001 | Fu et al. |
| 6,312,274 B1 | 11/2001 | Lin |
| 6,316,563 B2 | 11/2001 | Naijo et al. |
| 6,323,416 B1 | 11/2001 | Komori et al. |
| 6,324,211 B1 | 11/2001 | Ovard et al. |
| 6,325,294 B2 | 12/2001 | Tuttle et al. |
| 6,329,213 B1 | 12/2001 | Tuttle et al. |
| 6,339,236 B1 | 1/2002 | Tomii et al. |
| 6,344,366 B1 | 2/2002 | Bates |
| 6,344,419 B1 | 2/2002 | Forster et al. |
| 6,344,795 B1 | 2/2002 | Gehlot |
| 6,350,353 B2 | 2/2002 | Gopalraja et al. |
| 6,351,630 B2 | 2/2002 | Wood, Jr. |
| 6,356,230 B1 | 3/2002 | Greef et al. |
| 6,356,694 B1 | 3/2002 | Weber |
| 6,356,764 B1 | 3/2002 | Ovard et al. |
| 6,358,810 B1 | 3/2002 | Dornfest et al. |
| 6,360,954 B1 | 3/2002 | Barnardo |
| 6,361,662 B1 | 3/2002 | Chiba et al. |
| 6,365,300 B1 | 4/2002 | Ota et al. |
| 6,365,319 B1 | 4/2002 | Heath et al. |
| 6,368,275 B1 | 4/2002 | Sliwa et al. |
| 6,369,316 B1 | 4/2002 | Plessing et al. |
| 6,372,098 B1 | 4/2002 | Newcomb et al. |
| 6,372,383 B1 | 4/2002 | Lee et al. |
| 6,372,386 B1 | 4/2002 | Cho et al. |
| 6,373,224 B1 | 4/2002 | Goto et al. |
| 6,375,780 B1 | 4/2002 | Tuttle et al. |
| 6,376,027 B1 | 4/2002 | Lee et al. |
| 6,379,835 B1 | 4/2002 | Kucherovsky et al. |
| 6,379,842 B1 | 4/2002 | Mayer |
| 6,380,477 B1 | 4/2002 | Curtin |
| 6,384,573 B1 | 5/2002 | Dunn |
| 6,387,563 B1 | 5/2002 | Bates |
| 6,391,166 B1 | 5/2002 | Wang |
| 6,392,565 B1 | 5/2002 | Brown |
| 6,394,598 B1 | 5/2002 | Kaiser |
| 6,395,430 B1 | 5/2002 | Cho et al. |
| 6,396,001 B1 | 5/2002 | Nakamura |
| 6,398,824 B1 | 6/2002 | Johnson |
| 6,399,241 B1 | 6/2002 | Hara et al. |
| 6,402,039 B1 | 6/2002 | Freeman et al. |
| 6,402,795 B1 | 6/2002 | Chu et al. |
| 6,402,796 B1 | 6/2002 | Johnson |
| 6,409,965 B1 | 6/2002 | Nagata et al. |
| 6,413,284 B1 | 7/2002 | Chu et al. |
| 6,413,285 B1 | 7/2002 | Chu et al. |
| 6,413,382 B1 | 7/2002 | Wang et al. |
| 6,413,645 B1 | 7/2002 | Graff et al. |
| 6,413,676 B1 | 7/2002 | Munshi |
| 6,414,626 B1 | 7/2002 | Greef et al. |
| 6,416,598 B1 | 7/2002 | Sircar |
| 6,420,961 B1 | 7/2002 | Bates et al. |
| 6,422,698 B2 | 7/2002 | Kaiser |
| 6,423,106 B1 | 7/2002 | Bates |
| 6,423,776 B1 | 7/2002 | Akkapeddi et al. |
| 6,426,163 B1 | 7/2002 | Pasquier et al. |
| 6,432,577 B1 | 8/2002 | Shul et al. |
| 6,432,584 B1 | 8/2002 | Visco et al. |
| 6,433,380 B2 | 8/2002 | Shin |
| 6,433,465 B1 | 8/2002 | McKnight et al. |
| 6,436,156 B1 | 8/2002 | Wandeloski et al. |
| 6,437,231 B2 | 8/2002 | Kurata et al. |
| 6,444,336 B1 | 9/2002 | Jia et al. |
| 6,444,355 B1 | 9/2002 | Murai et al. |
| 6,444,368 B1 | 9/2002 | Hikmet et al. |
| 6,444,750 B1 | 9/2002 | Touhsaent |
| 6,459,418 B1 | 10/2002 | Comiskey et al. |
| 6,459,726 B1 | 10/2002 | Ovard et al. |
| 6,466,771 B2 | 10/2002 | Wood, Jr. |
| 6,475,668 B1 | 11/2002 | Hosokawa et al. |
| 6,481,623 B1 | 11/2002 | Grant et al. |
| 6,488,822 B1 | 12/2002 | Moslehi |
| 6,494,999 B1 | 12/2002 | Herrera et al. |
| 6,495,283 B1 | 12/2002 | Yoon et al. |
| 6,497,598 B2 | 12/2002 | Affinito |
| 6,500,287 B1 | 12/2002 | Azens et al. |
| 6,503,661 B1 | 1/2003 | Park et al. |
| 6,503,831 B2 | 1/2003 | Speakman |
| 6,506,289 B2 | 1/2003 | Demaray et al. |
| 6,511,516 B1 | 1/2003 | Johnson et al. |
| 6,511,615 B1 | 1/2003 | Dawes et al. |
| 6,517,968 B2 | 2/2003 | Johnson et al. |
| 6,522,067 B1 | 2/2003 | Graff et al. |
| 6,524,466 B1 | 2/2003 | Bonaventura et al. |
| 6,524,750 B1 | 2/2003 | Mansuetto |
| 6,525,976 B1 | 2/2003 | Johnson |
| 6,528,212 B1 | 3/2003 | Kusumoto et al. |
| 6,533,907 B2 | 3/2003 | Demaray et al. |
| 6,537,428 B1 | 3/2003 | Xiong et al. |
| 6,538,211 B2 | 3/2003 | St. Lawrence et al. |
| 6,541,147 B1 | 4/2003 | McLean et al. |
| 6,548,912 B1 | 4/2003 | Graff et al. |
| 6,549,688 B2 | 4/2003 | Bazylenko |
| 6,551,745 B2 | 4/2003 | Moutsios et al. |
| 6,558,836 B1 | 5/2003 | Whitacre et al. |
| 6,562,513 B1 | 5/2003 | Takeuchi et al. |
| 6,563,998 B1 | 5/2003 | Farah et al. |
| 6,569,564 B1 | 5/2003 | Lane |
| 6,570,325 B2 | 5/2003 | Graff et al. |
| 6,572,173 B2 | 6/2003 | Muller |
| 6,573,652 B1 | 6/2003 | Graff et al. |
| 6,576,546 B2 | 6/2003 | Gilbert et al. |
| 6,579,728 B2 | 6/2003 | Grant et al. |
| 6,582,480 B2 | 6/2003 | Pasquier et al. |
| 6,582,481 B1 | 6/2003 | Erbil |
| 6,582,852 B1 | 6/2003 | Gao et al. |
| 6,589,299 B2 | 7/2003 | Missling et al. |
| 6,593,150 B2 | 7/2003 | Ramberg et al. |
| 6,599,662 B1 | 7/2003 | Chiang et al. |
| 6,600,905 B2 | 7/2003 | Greeff et al. |
| 6,602,338 B2 | 8/2003 | Chen et al. |
| 6,603,139 B1 | 8/2003 | Tessler et al. |
| 6,603,391 B1 | 8/2003 | Greeff et al. |
| 6,605,228 B1 | 8/2003 | Kawaguchi et al. |
| 6,608,464 B1 | 8/2003 | Lew et al. |
| 6,610,440 B1 | 8/2003 | LaFollette et al. |
| 6,615,614 B1 | 9/2003 | Makikawa et al. |
| 6,616,035 B2 | 9/2003 | Ehrensvard et al. |
| 6,618,829 B2 | 9/2003 | Pax et al. |
| 6,620,545 B2 | 9/2003 | Goenka et al. |
| 6,622,049 B2 | 9/2003 | Penner et al. |
| 6,632,563 B1 | 10/2003 | Krasnov et al. |
| 6,637,906 B2 | 10/2003 | Knoerzer et al. |
| 6,637,916 B2 | 10/2003 | Mullner |
| 6,639,578 B1 | 10/2003 | Comiskey et al. |
| 6,641,704 B2 | 11/2003 | Someno |
| 6,645,675 B1 | 11/2003 | Munshi |
| 6,650,000 B2 | 11/2003 | Ballantine et al. |
| 6,650,942 B2 | 11/2003 | Howard et al. |
| 6,662,430 B2 | 12/2003 | Brady et al. |
| 6,664,006 B1 | 12/2003 | Munshi |
| 6,673,484 B2 | 1/2004 | Matsuura |
| 6,673,716 B1 | 1/2004 | D'Couto et al. |

(56) References Cited

U.S. PATENT DOCUMENTS

| | | |
|---|---|---|
| 6,674,159 B1 | 1/2004 | Peterson et al. |
| 6,677,070 B2 | 1/2004 | Kearl |
| 6,683,244 B2 | 1/2004 | Fujimori et al. |
| 6,683,749 B2 | 1/2004 | Daby et al. |
| 6,686,096 B1 | 2/2004 | Chung |
| 6,693,840 B2 | 2/2004 | Shimada et al. |
| 6,700,491 B2 | 3/2004 | Shafer |
| 6,706,449 B2 | 3/2004 | Mikhaylik et al. |
| 6,709,778 B2 | 3/2004 | Johnson |
| 6,713,216 B2 | 3/2004 | Kugai et al. |
| 6,713,389 B2 | 3/2004 | Speakman |
| 6,713,987 B2 | 3/2004 | Krasnov et al. |
| 6,723,140 B2 | 4/2004 | Chu et al. |
| 6,730,423 B2 | 5/2004 | Einhart et al. |
| 6,733,924 B1 | 5/2004 | Skotheim et al. |
| 6,737,197 B2 | 5/2004 | Chu et al. |
| 6,737,789 B2 | 5/2004 | Radziemski et al. |
| 6,741,178 B1 | 5/2004 | Tuttle |
| 6,750,156 B2 | 6/2004 | Le et al. |
| 6,751,241 B2 | 6/2004 | Davis et al. |
| 6,752,842 B2 | 6/2004 | Luski et al. |
| 6,753,108 B1 | 6/2004 | Hampden-Smith et al. |
| 6,753,114 B2 | 6/2004 | Jacobs et al. |
| 6,760,520 B1 | 7/2004 | Medin et al. |
| 6,764,525 B1 | 7/2004 | Whitacre et al. |
| 6,768,246 B2 | 7/2004 | Pelrine et al. |
| 6,768,855 B1 | 7/2004 | Bakke et al. |
| 6,770,176 B2 | 8/2004 | Benson et al. |
| 6,773,848 B1 | 8/2004 | Nortoft et al. |
| 6,780,208 B2 | 8/2004 | Hopkins et al. |
| 6,797,428 B1 | 9/2004 | Skotheim et al. |
| 6,797,429 B1 | 9/2004 | Komatsu |
| 6,805,998 B2 | 10/2004 | Jensen et al. |
| 6,805,999 B2 | 10/2004 | Lee et al. |
| 6,818,356 B1 | 11/2004 | Bates |
| 6,822,157 B2 | 11/2004 | Fujioka |
| 6,824,922 B2 | 11/2004 | Park et al. |
| 6,827,826 B2 | 12/2004 | Demaray et al. |
| 6,828,063 B2 | 12/2004 | Park et al. |
| 6,828,065 B2 | 12/2004 | Munshi |
| 6,830,846 B2 | 12/2004 | Kramlich et al. |
| 6,835,493 B2 | 12/2004 | Zhang et al. |
| 6,838,209 B2 | 1/2005 | Langan et al. |
| 6,846,765 B2 | 1/2005 | Imamura et al. |
| 6,849,165 B2 | 2/2005 | Kloppel et al. |
| 6,852,139 B2 | 2/2005 | Zhang et al. |
| 6,855,441 B1 | 2/2005 | Levanon |
| 6,861,821 B2 | 3/2005 | Masumoto et al. |
| 6,863,699 B1 | 3/2005 | Krasnov et al. |
| 6,866,901 B2 | 3/2005 | Burrows et al. |
| 6,866,963 B2 | 3/2005 | Seung et al. |
| 6,869,722 B2 | 3/2005 | Kearl |
| 6,884,327 B2 | 4/2005 | Pan et al. |
| 6,886,240 B2 | 5/2005 | Zhang et al. |
| 6,896,992 B2 | 5/2005 | Kearl |
| 6,899,975 B2 | 5/2005 | Watanabe et al. |
| 6,902,660 B2 | 6/2005 | Lee et al. |
| 6,905,578 B1 | 6/2005 | Moslehi et al. |
| 6,906,436 B2 | 6/2005 | Jenson et al. |
| 6,911,667 B2 | 6/2005 | Pichler et al. |
| 6,916,679 B2 | 7/2005 | Snyder et al. |
| 6,921,464 B2 | 7/2005 | Krasnov et al. |
| 6,923,702 B2 | 8/2005 | Graff et al. |
| 6,924,164 B2 | 8/2005 | Jenson |
| 6,929,879 B2 | 8/2005 | Yamazaki |
| 6,936,377 B2 | 8/2005 | Wensley et al. |
| 6,936,381 B2 | 8/2005 | Skotheim et al. |
| 6,936,407 B2 | 8/2005 | Pichler |
| 6,949,389 B2 | 9/2005 | Pichler et al. |
| 6,955,986 B2 | 10/2005 | Li |
| 6,962,613 B2 | 11/2005 | Jenson |
| 6,962,671 B2 | 11/2005 | Martin et al. |
| 6,964,829 B2 | 11/2005 | Utsugi et al. |
| 6,982,132 B1 | 1/2006 | Goldner et al. |
| 6,986,965 B2 | 1/2006 | Jenson et al. |
| 6,994,933 B1 | 2/2006 | Bates |
| 7,022,431 B2 | 4/2006 | Shchori et al. |
| 7,033,406 B2 | 4/2006 | Weir et al. |
| 7,045,246 B2 | 5/2006 | Simburger et al. |
| 7,045,372 B2 | 5/2006 | Ballantine et al. |
| 7,056,620 B2 | 6/2006 | Krasnov et al. |
| 7,073,723 B2 | 7/2006 | Fürst et al. |
| 7,095,372 B2 | 8/2006 | Soler Castany et al. |
| 7,129,166 B2 | 10/2006 | Speakman |
| 7,131,189 B2 | 11/2006 | Jenson |
| 7,144,654 B2 | 12/2006 | LaFollette et al. |
| 7,144,655 B2 | 12/2006 | Jenson et al. |
| 7,157,187 B2 | 1/2007 | Jenson |
| 7,158,031 B2 | 1/2007 | Tuttle |
| 7,162,392 B2 | 1/2007 | Vock et al. |
| 7,183,693 B2 | 2/2007 | Brantner et al. |
| 7,186,479 B2 | 3/2007 | Krasnov et al. |
| 7,194,801 B2 | 3/2007 | Jenson et al. |
| 7,198,832 B2 | 4/2007 | Burrows et al. |
| 7,202,825 B2 | 4/2007 | Leizerovich et al. |
| 7,205,662 B2 | 4/2007 | Narasimhan et al. |
| 7,218,809 B2 | 5/2007 | Zhou et al. |
| 7,220,517 B2 | 5/2007 | Park et al. |
| 7,230,321 B2 | 6/2007 | McCain |
| 7,238,628 B2 | 7/2007 | Demaray et al. |
| 7,247,408 B2 | 7/2007 | Skotheim et al. |
| 7,253,494 B2 | 8/2007 | Mino et al. |
| 7,262,131 B2 | 8/2007 | Narasimhan et al. |
| 7,265,674 B2 | 9/2007 | Tuttle |
| 7,267,904 B2 | 9/2007 | Komatsu et al. |
| 7,267,906 B2 | 9/2007 | Mizuta et al. |
| 7,273,682 B2 | 9/2007 | Park et al. |
| 7,274,118 B2 | 9/2007 | Jenson et al. |
| 7,288,340 B2 | 10/2007 | Iwamoto |
| 7,316,867 B2 | 1/2008 | Park et al. |
| 7,323,634 B2 | 1/2008 | Speakman |
| 7,332,363 B2 | 2/2008 | Edwards |
| 7,335,441 B2 | 2/2008 | Luski et al. |
| RE40,137 E | 3/2008 | Tuttle et al. |
| 7,340,124 B2 | 3/2008 | Patel et al. |
| 7,345,647 B1 | 3/2008 | Rodenbeck |
| 7,348,099 B2 | 3/2008 | Mukai et al. |
| 7,378,356 B2 | 5/2008 | Zhang et al. |
| 7,381,657 B2 | 6/2008 | Zhang et al. |
| 7,389,580 B2 | 6/2008 | Jenson et al. |
| 7,400,253 B2 | 7/2008 | Cohen |
| 7,404,877 B2 | 7/2008 | Demaray et al. |
| 7,410,730 B2 | 8/2008 | Bates |
| 7,413,998 B2 | 8/2008 | Zhang et al. |
| RE40,531 E | 10/2008 | Graff et al. |
| 7,468,221 B2 | 12/2008 | LaFollette et al. |
| 7,469,558 B2 | 12/2008 | Demaray et al. |
| 7,494,742 B2 | 2/2009 | Tarnowski et al. |
| 7,544,276 B2 | 6/2009 | Zhang et al. |
| 7,670,724 B1 | 3/2010 | Chan et al. |
| 7,826,702 B2 | 11/2010 | Dawes |
| 7,838,133 B2 | 11/2010 | Zhang et al. |
| 8,045,832 B2 | 10/2011 | Pan et al. |
| 8,076,005 B2 | 12/2011 | Demaray et al. |
| 8,105,466 B2 | 1/2012 | Zhang et al. |
| 2001/0027159 A1 | 10/2001 | Kaneyoshi |
| 2001/0031122 A1 | 10/2001 | Lackritz et al. |
| 2001/0032666 A1 | 10/2001 | Jenson et al. |
| 2001/0033952 A1 | 10/2001 | Jenson et al. |
| 2001/0034106 A1 | 10/2001 | Moise et al. |
| 2001/0041294 A1 | 11/2001 | Chu et al. |
| 2001/0041460 A1 | 11/2001 | Wiggins |
| 2001/0050223 A1 | 12/2001 | Gopalraja et al. |
| 2001/0052752 A1 | 12/2001 | Ghosh et al. |
| 2001/0054437 A1 | 12/2001 | Komori et al. |
| 2001/0055719 A1 | 12/2001 | Akashi et al. |
| 2002/0000034 A1 | 1/2002 | Jenson |
| 2002/0001746 A1 | 1/2002 | Jenson |
| 2002/0001747 A1 | 1/2002 | Jenson |
| 2002/0004167 A1 | 1/2002 | Jenson et al. |
| 2002/0009630 A1 | 1/2002 | Gao et al. |
| 2002/0019296 A1 | 2/2002 | Freeman et al. |
| 2002/0028377 A1 | 3/2002 | Gross |
| 2002/0028555 A1 | 3/2002 | Boyd et al. |

(56) References Cited

U.S. PATENT DOCUMENTS

| | | |
|---|---|---|
| 2002/0033330 A1 | 3/2002 | Demaray et al. |
| 2002/0037756 A1 | 3/2002 | Jacobs et al. |
| 2002/0048941 A1 | 4/2002 | Kato et al. |
| 2002/0066539 A1 | 6/2002 | Muller |
| 2002/0067615 A1 | 6/2002 | Muller |
| 2002/0076133 A1 | 6/2002 | Li et al. |
| 2002/0091929 A1 | 7/2002 | Ehrensvard |
| 2002/0093029 A1 | 7/2002 | Ballantine et al. |
| 2002/0106297 A1 | 8/2002 | Ueno et al. |
| 2002/0108649 A1 | 8/2002 | Fujimori et al. |
| 2002/0115252 A1 | 8/2002 | Haukka et al. |
| 2002/0134671 A1 | 9/2002 | Demaray et al. |
| 2002/0139662 A1 | 10/2002 | Lee |
| 2002/0140103 A1 | 10/2002 | Kloster et al. |
| 2002/0159245 A1 | 10/2002 | Murasko et al. |
| 2002/0161404 A1 | 10/2002 | Schmidt |
| 2002/0164441 A1 | 11/2002 | Amine et al. |
| 2002/0170821 A1 | 11/2002 | Sandlin et al. |
| 2002/0170960 A1 | 11/2002 | Ehrensvard et al. |
| 2003/0007718 A1 | 1/2003 | Bazylenko |
| 2003/0019326 A1 | 1/2003 | Han et al. |
| 2003/0022487 A1 | 1/2003 | Yoon et al. |
| 2003/0024994 A1 | 2/2003 | Ladyansky |
| 2003/0029493 A1 | 2/2003 | Plessing |
| 2003/0035906 A1 | 2/2003 | Memarian et al. |
| 2003/0036003 A1 | 2/2003 | Shchori et al. |
| 2003/0042131 A1 | 3/2003 | Johnson |
| 2003/0044665 A1 | 3/2003 | Rastegar et al. |
| 2003/0048635 A1 | 3/2003 | Knoerzer et al. |
| 2003/0063629 A1 | 4/2003 | Davis et al. |
| 2003/0063883 A1 | 4/2003 | Demaray et al. |
| 2003/0064292 A1 | 4/2003 | Neudecker et al. |
| 2003/0068559 A1 | 4/2003 | Armstrong et al. |
| 2003/0077914 A1 | 4/2003 | Le et al. |
| 2003/0079838 A1 | 5/2003 | Brcka |
| 2003/0091904 A1 | 5/2003 | Munshi |
| 2003/0095463 A1 | 5/2003 | Shimada et al. |
| 2003/0097858 A1 | 5/2003 | Strohhofer et al. |
| 2003/0109903 A1 | 6/2003 | Berrang et al. |
| 2003/0127319 A1 | 7/2003 | Demaray et al. |
| 2003/0134054 A1 | 7/2003 | Demaray et al. |
| 2003/0141186 A1 | 7/2003 | Wang et al. |
| 2003/0143853 A1 | 7/2003 | Celii et al. |
| 2003/0152829 A1 | 8/2003 | Zhang et al. |
| 2003/0162094 A1 | 8/2003 | Lee et al. |
| 2003/0173207 A1 | 9/2003 | Zhang et al. |
| 2003/0173208 A1 | 9/2003 | Pan et al. |
| 2003/0174391 A1 | 9/2003 | Pan et al. |
| 2003/0175142 A1 | 9/2003 | Milonopoulou et al. |
| 2003/0178623 A1 | 9/2003 | Nishiki et al. |
| 2003/0178637 A1 | 9/2003 | Chen et al. |
| 2003/0180610 A1 | 9/2003 | Felde et al. |
| 2003/0185266 A1 | 10/2003 | Henrichs |
| 2003/0231106 A1 | 12/2003 | Shafer |
| 2003/0232248 A1 | 12/2003 | Iwamoto et al. |
| 2003/0234835 A1 | 12/2003 | Torii et al. |
| 2004/0008587 A1 | 1/2004 | Siebott et al. |
| 2004/0015735 A1 | 1/2004 | Norman |
| 2004/0023106 A1 | 2/2004 | Benson et al. |
| 2004/0028875 A1 | 2/2004 | Van Rijn et al. |
| 2004/0029311 A1 | 2/2004 | Snyder et al. |
| 2004/0038050 A1 | 2/2004 | Saijo et al. |
| 2004/0043557 A1 | 3/2004 | Haukka et al. |
| 2004/0048157 A1 | 3/2004 | Neudecker et al. |
| 2004/0058237 A1 | 3/2004 | Higuchi et al. |
| 2004/0077161 A1 | 4/2004 | Chen et al. |
| 2004/0078662 A1 | 4/2004 | Hamel et al. |
| 2004/0081415 A1 | 4/2004 | Demaray et al. |
| 2004/0081860 A1 | 4/2004 | Hundt et al. |
| 2004/0085002 A1 | 5/2004 | Pearce |
| 2004/0101761 A1 | 5/2004 | Park et al. |
| 2004/0105644 A1 | 6/2004 | Dawes |
| 2004/0106038 A1 | 6/2004 | Shimamura et al. |
| 2004/0106046 A1 | 6/2004 | Inda |
| 2004/0118700 A1 | 6/2004 | Schierle-Arndt et al. |
| 2004/0126305 A1 | 7/2004 | Chen et al. |
| 2004/0151986 A1 | 8/2004 | Park et al. |
| 2004/0161640 A1 | 8/2004 | Salot |
| 2004/0175624 A1 | 9/2004 | Luski et al. |
| 2004/0188239 A1 | 9/2004 | Robison et al. |
| 2004/0208454 A1 | 10/2004 | Montgomery et al. |
| 2004/0209159 A1 | 10/2004 | Lee et al. |
| 2004/0219434 A1 | 11/2004 | Benson et al. |
| 2004/0245561 A1 | 12/2004 | Sakashita et al. |
| 2004/0258984 A1 | 12/2004 | Ariel et al. |
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 | 3/2005 | Zhang et al. |
| 2005/0070097 A1 | 3/2005 | Barmak et al. |
| 2005/0072458 A1 | 4/2005 | Goldstein |
| 2005/0079418 A1 | 4/2005 | Kelley et al. |
| 2005/0095506 A1 | 5/2005 | Klaassen |
| 2005/0105231 A1 | 5/2005 | Hamel et al. |
| 2005/0105853 A1 | 5/2005 | Liu et al. |
| 2005/0110457 A1 | 5/2005 | LaFollette et al. |
| 2005/0112461 A1 | 5/2005 | Amine et al. |
| 2005/0118464 A1 | 6/2005 | Levanon |
| 2005/0130032 A1 | 6/2005 | Krasnov et al. |
| 2005/0133361 A1 | 6/2005 | Ding et al. |
| 2005/0141170 A1 | 6/2005 | Honda et al. |
| 2005/0142447 A1 | 6/2005 | Nakai et al. |
| 2005/0147877 A1 | 7/2005 | Tarnowski et al. |
| 2005/0158622 A1 | 7/2005 | Mizuta et al. |
| 2005/0175891 A1 | 8/2005 | Kameyama et al. |
| 2005/0176181 A1 | 8/2005 | Burrows et al. |
| 2005/0181280 A1 | 8/2005 | Ceder et al. |
| 2005/0183946 A1 | 8/2005 | Pan et al. |
| 2005/0189139 A1 | 9/2005 | Stole |
| 2005/0208371 A1 | 9/2005 | Kim et al. |
| 2005/0225839 A1 | 10/2005 | Patel et al. |
| 2005/0239917 A1 | 10/2005 | Nelson et al. |
| 2005/0266161 A1 | 12/2005 | Medeiros et al. |
| 2006/0019504 A1 | 1/2006 | Taussig |
| 2006/0021214 A1 | 2/2006 | Jenson et al. |
| 2006/0040177 A1 | 2/2006 | Onodera et al. |
| 2006/0046907 A1 | 3/2006 | Rastegar et al. |
| 2006/0054496 A1 | 3/2006 | Zhang et al. |
| 2006/0057283 A1 | 3/2006 | Zhang et al. |
| 2006/0057304 A1 | 3/2006 | Zhang et al. |
| 2006/0063074 A1 | 3/2006 | Jenson et al. |
| 2006/0071592 A1 | 4/2006 | Narasimhan et al. |
| 2006/0155545 A1 | 7/2006 | Janye |
| 2006/0201583 A1 | 9/2006 | Michaluk et al. |
| 2006/0210779 A1 | 9/2006 | Weir et al. |
| 2006/0222954 A1 | 10/2006 | Skotheim et al. |
| 2006/0234130 A1 | 10/2006 | Inda |
| 2006/0237543 A1 | 10/2006 | Goto et al. |
| 2006/0255435 A1 | 11/2006 | Fuergut et al. |
| 2006/0286448 A1 | 12/2006 | Snyder et al. |
| 2007/0009802 A1 | 1/2007 | Lee et al. |
| 2007/0023275 A1 | 2/2007 | Tanase et al. |
| 2007/0037058 A1 | 2/2007 | Visco et al. |
| 2007/0053139 A1 | 3/2007 | Zhang et al. |
| 2007/0087230 A1 | 4/2007 | Jenson et al. |
| 2007/0091543 A1 | 4/2007 | Gasse et al. |
| 2007/0125638 A1 | 6/2007 | Zhang et al. |
| 2007/0141468 A1 | 6/2007 | Barker |
| 2007/0148065 A1 | 6/2007 | Weir et al. |
| 2007/0148553 A1 | 6/2007 | Weppner |
| 2007/0151661 A1 | 7/2007 | Mao et al. |
| 2007/0164376 A1 | 7/2007 | Burrows et al. |
| 2007/0166612 A1 | 7/2007 | Krasnov et al. |
| 2007/0172681 A1 | 7/2007 | Demaray et al. |
| 2007/0184345 A1 | 8/2007 | Neudecker et al. |
| 2007/0196682 A1 | 8/2007 | Visser et al. |
| 2007/0202395 A1 | 8/2007 | Snyder et al. |
| 2007/0205513 A1 | 9/2007 | Brunnbauer et al. |
| 2007/0210459 A1 | 9/2007 | Burrows et al. |
| 2007/0224951 A1 | 9/2007 | Gilb et al. |
| 2007/0263676 A1 | 11/2007 | Beukema et al. |
| 2007/0264564 A1 | 11/2007 | Johnson et al. |
| 2007/0278653 A1 | 12/2007 | Brunnbauer et al. |
| 2007/0298326 A1 | 12/2007 | Angell et al. |

(56) References Cited

U.S. PATENT DOCUMENTS

| | | | |
|---|---|---|---|
| 2008/0003496 | A1 | 1/2008 | Neudecker et al. |
| 2008/0008936 | A1 | 1/2008 | Mizuta et al. |
| 2008/0014501 | A1 | 1/2008 | Skotheim et al. |
| 2008/0057397 | A1 | 3/2008 | Skotheim et al. |
| 2008/0107376 | A1 | 5/2008 | Patel et al. |
| 2008/0213672 | A1 | 9/2008 | Skotheim et al. |
| 2008/0233708 | A1 | 9/2008 | Hisamatsu |
| 2008/0254575 | A1 | 10/2008 | Fuergut et al. |
| 2008/0261107 | A1 | 10/2008 | Snyder et al. |
| 2008/0286651 | A1 | 11/2008 | Neudecker et al. |
| 2009/0181303 | A1 | 7/2009 | Neudecker et al. |
| 2010/0032001 | A1 | 2/2010 | Brantner |
| 2010/0086853 | A1 | 4/2010 | Venkatachalam et al. |

FOREIGN PATENT DOCUMENTS

| | | |
|---|---|---|
| CN | 1532984 | 9/2004 |
| CN | 101073171 B | 9/2010 |
| CN | 1756856 B | 10/2011 |
| CN | 1826423 B | 11/2011 |
| CN | 101511493 B | 5/2012 |
| CN | 101931097 B | 11/2012 |
| DE | 10 2005 014 427 | 9/2006 |
| DE | 10 2006 054 309 | 11/2006 |
| DE | 10 2008 016 665 | 10/2008 |
| DE | 10 2007 030 604 | 1/2009 |
| EP | 0 510 883 A2 | 10/1992 |
| EP | 0 639 655 A1 | 2/1995 |
| EP | 0 652 308 A2 | 5/1995 |
| EP | 0 820 088 A2 | 1/1998 |
| EP | 1 068 899 A1 | 1/2001 |
| EP | 0 867 985 B1 | 2/2001 |
| EP | 1 092 689 A1 | 4/2001 |
| EP | 1 189 080 A2 | 3/2002 |
| EP | 1 713 024 | 10/2006 |
| EP | 1825545 B1 | 11/2009 |
| EP | 1597408 B1 | 12/2012 |
| EP | 1633902 B1 | 12/2012 |
| FR | 2 861 218 | 4/2005 |
| JP | 55-009305 | 1/1980 |
| JP | 56-156675 | 12/1981 |
| JP | 60-068558 | 4/1985 |
| JP | 61-60803 | 3/1986 |
| JP | 62-267944 | 11/1987 |
| JP | 62-287071 | 12/1987 |
| JP | 2-054764 A2 | 2/1990 |
| JP | 2-230662 | 9/1990 |
| JP | 4-058456 | 2/1992 |
| JP | 4-072049 | 3/1992 |
| JP | 6-010127 A | 1/1994 |
| JP | 6-100333 A | 4/1994 |
| JP | 7-233469 A | 5/1995 |
| JP | 7-224379 A | 8/1995 |
| JP | 09-249962 * | 9/1997 |
| JP | 11-204088 | 7/1999 |
| JP | 2000-144435 | 5/2000 |
| JP | 2000-188099 | 7/2000 |
| JP | 2000-268867 | 9/2000 |
| JP | 2001-259494 | 9/2001 |
| JP | 2001-297764 | 10/2001 |
| JP | 2001-328198 | 11/2001 |
| JP | 2002-344115 | 11/2002 |
| JP | 2003-17040 | 1/2003 |
| JP | 2003-073824 | 3/2003 |
| JP | 2003-234100 | 8/2003 |
| JP | 2003-347045 | 12/2003 |
| JP | 2004-071305 | 3/2004 |
| JP | 2004-149849 | 5/2004 |
| JP | 2004-158268 | 6/2004 |
| JP | 2004-273436 | 9/2004 |
| JP | 2004-335192 | 11/2004 |
| JP | 2005-256101 | 9/2005 |
| JP | 2002-203562 | 7/2012 |
| JP | 5095412 B2 | 12/2012 |
| KR | 2002-0007881 | 1/2002 |
| KR | 2002-0017790 | 3/2002 |
| KR | 2002-0029813 | 4/2002 |
| KR | 2002-0038917 | 5/2002 |
| KR | 2003-0033913 | 5/2003 |
| KR | 2003-0042288 | 5/2003 |
| KR | 2003-0085252 | 11/2003 |
| KR | 10-1021536 B1 | 3/2011 |
| RU | 2241281 | 11/2004 |
| TW | 478162 B | 3/2002 |
| WO | WO 95/13629 | 5/1995 |
| WO | WO 96/23085 A1 | 8/1996 |
| WO | WO 96/23217 | 8/1996 |
| WO | WO 97/027344 | 7/1997 |
| WO | WO 97/35044 A1 | 9/1997 |
| WO | WO 98/047196 | 10/1998 |
| WO | WO 99/43034 | 8/1999 |
| WO | WO 99/57770 | 11/1999 |
| WO | WO 00/21898 A1 | 4/2000 |
| WO | WO 00/22742 A2 | 4/2000 |
| WO | WO 00/28607 | 5/2000 |
| WO | WO 00/36665 A1 | 6/2000 |
| WO | WO 00/60682 | 10/2000 |
| WO | WO 00/60689 | 10/2000 |
| WO | WO 00/62365 | 10/2000 |
| WO | WO 01/01507 | 1/2001 |
| WO | WO 01/17052 | 3/2001 |
| WO | WO 01/24303 | 4/2001 |
| WO | WO 01/33651 | 5/2001 |
| WO | WO 01/39305 | 5/2001 |
| WO | WO 01/73864 | 10/2001 |
| WO | WO 01/73865 | 10/2001 |
| WO | WO 01/73866 | 10/2001 |
| WO | WO 01/73868 | 10/2001 |
| WO | WO 01/73870 | 10/2001 |
| WO | WO 01/73883 | 10/2001 |
| WO | WO 01/73957 | 10/2001 |
| WO | WO 01/82390 | 11/2001 |
| WO | WO 01/86731 | 11/2001 |
| WO | WO 02/12932 A2 | 2/2002 |
| WO | WO 02/42516 | 5/2002 |
| WO | WO 02/47187 | 6/2002 |
| WO | WO 02/071506 | 9/2002 |
| WO | WO 02/101857 | 12/2002 |
| WO | WO 03/003485 | 1/2003 |
| WO | WO 03/005477 | 1/2003 |
| WO | WO 03/026039 | 3/2003 |
| WO | WO 03/036670 | 5/2003 |
| WO | WO 03/069714 | 8/2003 |
| WO | WO 03/080325 | 10/2003 |
| WO | WO 03/083166 | 10/2003 |
| WO | WO 2004/012283 | 2/2004 |
| WO | WO 2004/021532 A1 | 3/2004 |
| WO | WO 2004/061887 | 7/2004 |
| WO | WO 2004/077519 A2 | 9/2004 |
| WO | WO 2004/086550 | 10/2004 |
| WO | WO 2004/106581 A2 | 12/2004 |
| WO | WO 2004/106582 A2 | 12/2004 |
| WO | WO 2005/008828 | 1/2005 |
| WO | WO 2005/013394 | 2/2005 |
| WO | WO 2005/024091 A1 | 3/2005 |
| WO | WO 2005/038957 | 4/2005 |
| WO | WO 2005/067645 | 7/2005 |
| WO | WO 2005/085138 | 9/2005 |
| WO | WO 2005/091405 | 9/2005 |
| WO | WO 2006/063308 A2 | 6/2006 |
| WO | WO 2006/138362 | 12/2006 |
| WO | WO 2007/016781 | 2/2007 |
| WO | WO 2007/027535 | 3/2007 |
| WO | WO 2007/095604 | 8/2007 |
| WO | WO 2008/036731 | 3/2008 |

OTHER PUBLICATIONS

Kelly, P.J. et al., "A novel technique for the deposition of aluminum-doped zinc oxide films," Thin Solid Films 426(1-2):111-116 (2003).
Snoeks, E. et al., "Cooperative upconversion in erbium-implanted soda-lime silicate glass optical waveguides," J. Opt. Soc. Am. B 12(8):1468-1474 (1995).

(56) References Cited

OTHER PUBLICATIONS

Response to Office Action filed on Oct. 17, 2005, in U.S. Appl. No. 10/291,179.
Final Office Action issued on Dec. 14, 2005 in U.S. Appl. No. 10/291,179.
Response to Final Office Action filed Apr. 14, 2006, in U.S. Appl. No. 10/291,179.
Office Action mailed Apr. 27, 2006, in U.S. Appl. No. 10/291,179.
Response to Office Action filed Jul. 27, 2006, in U.S. Appl. No. 10/291,179.
Final Office Action dated Oct. 12, 2006, in U.S. Appl. No. 10/291,179.
Notice of Allowance issued on Oct. 8, 2002, in U.S. Patent No. 6,533,907.
Response to Office Action filed Feb. 24, 2006, in U.S. Appl. No. 10/101,863.
Office Action mailed Mar. 22, 2006, in U.S. Appl. No. 10/101,863.
Response to Office Action filed Jun. 12, 2006, in U.S. Appl. No. 10/101,863.
Office Action mailed Sep. 6, 2006, in U.S. Appl. No. 10/101,863.
Response to Office Action filed on Dec. 21, 2005, in U.S. Appl. No. 10/954,182.
Office Action issued on Mar. 9, 2006, in U.S. Appl. No. 10/954,182.
Response to Office Action filed on Aug. 9, 2006, in U.S. Appl. No. 10/954,182.
Response to Office Action filed Mar. 2, 2006, in U.S. Appl. No. 10/789,953.
Final Office Action issued on May 19, 2006, in U.S. Appl. No. 10/789,953.
Office Action dated Sep. 22, 2006, from Korean Patent Office in Application No. 10-2005-7016055.
Office Action from Singapore Patent Office in Application No. 200505388-9, dated Mar. 20, 2006.
Response to Office Action from Singapore Patent Office in Application No. 200505388-9, dated Aug. 11, 2006.
Office Action dated Oct. 12, 2006, for U.S. Appl. No. 11/228,805.
Office Action mailed Apr. 19, 2006, in U.S. Appl. No. 10/851,542.
Response to Office Action filed Jul. 26, 2006, in U.S. Appl. No. 10/851,542.
Voluntary Amendment filed Aug. 15, 2006, in TW Application No. 94143175.
PCT International Search Report and Written Opinion for Application No. PCT/US05/44781 dated Oct. 3, 2006.
Specification as filed Sep. 2, 2005, for U.S. Appl. No. 11/218,652.
PCT Invitation to Pay Additional Fees for PCT/US01/22750, dated Mar. 13, 2002.
PCT International Search Report for PCT/US01/22750, dated Jul. 19, 2002.
PCT Written Opinion for PCT/US01/22750, dated Jul. 23, 2002.
PCT International Preliminary Examination Report for PCT/US01/22750, dated Oct. 8, 2002.
Final Office Action issued on Feb. 14, 2006, in U.S. Appl. No. 10/101,863.
Office Action issued on Feb. 13, 2006, in U.S. Appl. No. 10/101,341.
Response to Office Action filed on Jan. 3, 2006 in U.S. Appl. No. 10/650,461.
International Search Report mailed on Dec. 12, 2003 in PCT/US03/24809.
PCT International Preliminary Examination Report mailed Apr. 15, 2004 in PCT/US03/24809.
Specification and Preliminary Amendment as filed for U.S. Appl. No. 11/297,057.
International Search Report issued on Oct. 25, 2004 in PCT/US2004/005531.
Written Opinion issued on Oct. 25, 2004 in PCT/US2004/005531.
Response to Office Action filed Jan. 19, 2006 in U.S. Appl. No. 10/851,542.
PCT International Search Report of Application No. PCT/US2004/014524 dated Mar. 2, 2005.
PCT Written Opinion for Application No. PCT/US2004/014524, dated Mar. 2, 2005.
PCT International Preliminary Report on Patentability for Application No. PCT/US2004/014524, dated Dec. 8, 2005.
PCT International Search Report for Application No. PCT/US2004/014523 dated Jan. 17, 2005.
PCT Written Opinion for Application No. PCT/US2004/014523 dated Jan. 17, 2005.
PCT International Preliminary Report on Patentability for Application No. PCT/US2004/014523, dated Dec. 8, 2005.
Hwang et al., "Characterization of sputter-deposited $LiMn_2O_4$ thin films for rechargeable microbatteries", J. Electrochem. Soc., vol. 141, No. 12, Dec. 1994, pp. 3296-3299.
Kim et al., "Characteristics of rapid-thermal-annealed $LiCoO_2$ cathode film for an all-solid-state thin film microbattery", J. Vac. Sci. Technol. A, vol. 22, No. 4, Jul./Aug. 2004, pp. 1182-1187.
EPO Extended Search Report dated Feb. 11, 2008, for EP Application No. 07120523.1.
EPO Extended Search Report dated Feb. 26, 2008, for EP Application No. 05853649.1.
Anh et al., "Significant Suppression of Leakage Current in $(Ba,Sr)TiO_3$ Thin Films by Ni or Mn Doping," J. Appl. Phys., vol. 92, No. 5, pp. 2651-2654 (Sep. 2002).
Belkind, A. et al., "Pulsed-DC Reactive Sputtering of Dielectrics: Pulsing Parameter Effects," $43^{rd}$ Annual Technical Conference Proceedings.
Choy et al., "Eu-Doped Y2O3 Phosphor Films Produced by Electrostatic-Assisted Chemical Vapor Deposition," J. Mater. Res., vol. 14, No. 7, pp. 3111-3114 (Jul. 1999).
Kim et al., "Correlation Between the Microstructures and the Cycling Performance of $RuO_2$ Electrodes for Thin-Film Microsupercapacitors," J. Vac. Sci. Technol., vol. B 20(5), pp. 1827-1832 (Sep. 2002).
Park et al., "Characteristics of Pt Thin Film on the Conducting Ceramics TiO and Ebonex $(Ti_4O_7)$ as Electrode Materials," Thin Solid Films, 258, pp. 5-9 (1995).
Saha et al., "Large Reduction of Leakage Current by Graded-Layer La Doping in $(Ba_{0.5}, Sr_{0.5})TiO_3$ Thin Films," Applied Physics Letters, vol. 79, No. 1, pp. 111-113 (Jul. 2001).
Scholl, R., "Power Supplies for Pulsed Plasma Technologies: State-of-the-Art and Outlook," Advances Energy Industries, Inc., pp. 1-8 (1999).
Scholl, R., "Power Systems for Reactive Sputtering of Insulating Films," Advances Energy Industries, Inc., pp. 1-8 (Aug. 2001).
Preliminary Amendment filed Jul. 27, 2005, in U.S. Appl. No. 11/191,643.
Preliminary Amendment filed Sep. 16, 2005, in U.S. Appl. No. 11/228,834.
Corrected Preliminary Amendment filed Sep. 19, 2005, in U.S. Appl. No. 11/191,643.
Response to Final Office Action filed Aug. 3, 2006, in U.S. Appl. No. 10/789,953.
Notice of Allowance dated Oct. 23, 2006, in U.S. Appl. No. 10/789,953.
Final Office Action dated Oct. 26, 2006, in U.S. Appl. No. 10/851,542.
Office Action dated Oct. 31, 2006, in U.S. Appl. No. 10/954,182.
Response to Final Office Action filed Nov. 3, 2006, in U.S. Appl. No. 10/291,179.
Response to Office Action dated Nov. 8, 2006, to the Korean Patent Office in Application No. 10-2005-7016055.
Office Action dated Dec. 1, 2006, in U.S. Appl. No. 10/291,179.
Response to Office Action filed Dec. 6, 2006, in U.S. Appl. No. 10/954,182.
Continuation Application and Preliminary Amendment filed Dec. 13, 2006, in U.S. Appl. No. 11/638,680.
Response to Office Action dated Dec. 21, 2006, in U.S. Appl. No. 11/228,805.
International Search Report dated Dec. 21, 2006, for PCT Application No. PCT/US06/23143.
Response to Office Action filed Jan. 26, 2007, in U.S. Appl. No. 10/851,542.
Response to Office Action filed Feb. 6, 2007, in U.S. Appl. No. 10/101,863.

(56) References Cited

OTHER PUBLICATIONS

Supplementary Preliminary Amendment filed Feb. 6, 2007, in U.S. Appl. No. 11/228,834.
Supplementary Preliminary Amendment filed Feb. 6, 2007, in U.S. Appl. No. 11/191,643.
Notice of Allowance dated Feb. 21, 2007, in U.S. Appl. No. 10/789,953.
Notice of Allowance dated Feb. 22, 2007, in U.S. Appl. No. 10/851,542.
Response to Office Action and Terminal Disclaimer filed Mar. 1, 2007, in U.S. Appl. No. 10/291,179.
Voluntary Amendment dated Mar. 8, 2007, in TW Appl. No. 93114518.
Office Action dated Mar. 14, 2007, in U.S. Appl. No. 10/954,182.
Supplemental Notice of Allowance dated Mar. 15, 2007, in U.S. Appl. No. 10/851,542.
Application and Preliminary Amendment filed Mar. 22, 2007, in U.S. Appl. No. 11/726,972.
Notice of Allowance dated Mar. 26, 2007, in U.S. Appl. No. 11/228,805.
Response to Office Action filed Mar. 30, 2007, in U.S. Appl. No. 10/954,182.
Notice of Non-Compliant Amendment dated Apr. 12, 2007, in U.S. Appl. No. 10/954,182.
Response to Notice of Non-Compliant Amendment filed Apr. 23, 2007, in U.S. Appl. No. 10/954,182.
Final Office Action dated May 2, 2007, in U.S. Appl. No. 10/101,863.
Office Action dated May 21, 2007, in U.S. Appl. No. 10/291,179.
Office Communication with Corrected Notice of Allowance dated Jun. 7, 2007, in U.S. Appl. No. 11/228,805.
Issue Notification dated Jun. 13, 2007, in U.S. Appl. No. 10/851,542.
Cocorullo, G. et al., "Amorphous silicon waveguides and light modulators for integrated photonics realized by low-temperature plasma-enhanced chemical-vapor deposition," *Optics Lett. 21*(24):2002-2004 (1996).
Kelly, P.J. et al., "A novel technique for the deposition of aluminum-doped zinc oxide films", *Thin Solid Films 426*(1-2):111-116 (2003).
Tomaszewski, H. et al., "Yttria-stabilized zirconia thin films grown by reactive r.f magnetron sputtering," *Thin Solid Films 287*:104-109 (1996).
Office Action issued Nov. 28, 2001, for US Patent No. 6,506,289.
Response to Office Action filed Feb. 20, 2002, for US Patent No. 6,506,289.
Office Action issued Apr. 17, 2002, for US Patent No. 6,506,289.
Response to Office Action filed Jul. 17, 2002, for US Patent No. 6,506,289.
Notice of Allowance mailed Aug. 6, 2002, for US Patent No. 6,506,289.
Notice of Allowance mailed Nov. 10, 2003 for US Patent No. 6,827,826.
Response to Office Action filed Feb. 28, 2006 in U.S. Appl. No. 09/903,081.
Final Office Action mailed May 8, 2006 in U.S. Appl. No. 09/903,081.
Response to Office Action filed Feb. 17, 2006 in U.S. Appl. No. 11/100,856.
Final Office Action mailed Jun. 9, 2006 in U.S. Appl. No. 11/100,856.
Response to Office Action filed on Dec. 21, 2005 in U.S. Appl. No. 10/954,182.
Response to Office Action filed on May 15, 2006, in U.S. Appl. No. 10/101,341.
Office Action issued on Mar. 23, 2006, in U.S. Appl. No. 10/650,461.
Response to Office Action filed Mar. 2, 2006 in U.S. Appl. No. 10/789,953.
Final Office Action issued on May 19, 2006 in U.S. Appl. No. 10/789,953.
Office Action from Singapore Patent Office in Appl. No. 200505388-9, dated Mar. 20, 2006.
Office Action mailed Apr. 19, 2006 in U.S. Appl. No. 10/851,542.
Affinito, J.D. et al., "PML/oxide/PML Barrier Layer Performance Differences Arising from Use of UV or Electron Beam Polymerization of the PML Layers," *Thin Solid Films 308-309*:19-25 (1997).
Affinito, J.D. et al., "Polymer-Oxide Transparent Barrier Layers," Society of Vacuum Coaters, 39th Ann. Technical Conference Proceedings, May 5-10, 1996, Philadelphia, PA, pp. 392-397 (1996).
Alder, T. et al., "High-Efficiency Fiber-to-Chip Coupling Using Low-Loss Tapered Single-Mode Fiber," *IEEE Photonics Tech. Lett. 12*(8):1016-1018 (2000).
Almeida, V.R. et al., "Nanotaper for compact mode conversion," *Optics Letters 28*(15):1302-1304 (2003).
Asghari, M. and Dawnay, E., "ASOC™—A Manufacturing Integrated Optics Technology," *SPIE 3620*:252-262 (Jan. 1999).
Barbier, D. et al, "Amplifying Four-Wavelength Combiner, Based on Erbium/Ytterbium-Doped Waveguide Amplifiers and Integrated Splitters," *IEEE Photonics Tech. Lett..9*:315-317 (1997).
Barbier, D., "Performances and potential applications of erbium doped planar waveguide amplifiers and lasers," *Proc. OAA*, Victoria, BC, Canada, pp. 58-63 (Jul. 21-23, 1997).
Beach R.J., "Theory and optimization of lens ducts," *Applied Optics 35*(12):2005-2015 (1996).
Belkind, A. et al., "Using pulsed direct current power for reactive sputtering of $Al_2O_3$," *J. Vac. Sci. Technol. A 17*(4):1934-1940 (1999).
Bestwick, T., "ASOC[198 silicon integrated optics technology]," *SPIE 3631*:182-190 (1999).
Borsella, E. et al., "Structural incorporation of silver in soda-lime glass by the ion-exchange process: a photoluminescence spectroscopy study," *Applied Physics A 71*:125-132 (2000).
Byer, R.L., "Nonlinear Optics and Solid-state Lasers: 2000," *IEEE J. Selected Topics in Quantum Electronics 6*(6):911-930 (2000).
Campbell, S.A. et al., "Titanium dioxide ($TiO_2$)-based gate insulators," *IBM J. Res. Develop. 43*(3):383-392 (1999).
Chang, C.Y. and Sze, S.M. (Eds.), in: *ULSI Technology*, The McGraw-Hill Companies,.Inc., New York, Chapter 4, pp. 169-170, and 226-231 (1996).
Chen, G. et al. "Development of Supported Bifunctional Electrocatalysts for Unitized Regenerative Fuel Cells," *J. Electrochemical Society 149*(8):A1092-A1099 (2002).
Choi, Y.B. et al., "Er-Al-codoped silicate planar light waveguide-type amplifier fabricated by radio-frequency sputtering," *Optics Letters 25*(4):263-265 (2000).
Cooksey, K. et al. "Predicting Permeability & Transmission Rate for Multilayer Materials," *Food Technology 53*(9):60-63 (1999).
Crowder, M.A. et al., "Low-Temperature Single-Crystal Si TFT's Fabricated on Si Films Processed via Sequential Lateral Solidification," *IEEE Electron Device Lett. 19*(8):306-308 (1998).
Delavaux, J-M. et al., "Integrated optics erbium ytterbium amplifier system in 10Gb/s fiber transmission experiment," 22nd European Conference on Optical Communication, Oslo, I.123-I.126 (1996).
Distributed Energy Resources: Fuel Cells, Projects, 4 pages http://www.eere.energy.gov/der/fuel_cells/projects.html (2003).
Dorey, R.A., "Low temperature micromoulding of functional ceramic devices," Grant summary for GR/S84156/01 for the UK Engineering and Physical Sciences Research Council, 2 pages (2004).
DuPont Teijin Films, Mylar 200 SBL 300, Product Information, 4 pages (2000).
Electrometals Technologies Limited, Financial Report for 2002, Corporate Directory, Chairman's Review, Review of Operations, 10 pages (2002).
E-Tek website: FAQ, Inside E-Tek, E-Tek News, Products; http://www.etek-inc.com/, 10 pages (2003).
Flytzanis, C. et al, "Nonlinear Optics in Composite Materials," in: *Progress in Optics XXIX*, Elsevier Science Publishers B.V., pp. 323-425 (1991).
Frazao, O. et al., "EDFA Gain Flattening Using Long-Period Fibre Gratings Based on the Electric Arc Technique," *Proc. London Comm. Symp.* 2001, London, England, 3 pages (2001).
Fujii, M. et al., "1.54 μm photoluminescence of $Er^{3+}$ doped into $SiO_2$ films containing Si nanocrystals: Evidence for energy transfer from Si nanocrystals for $Er^{3+}$," *Appl. Phys. Lett. 71*(9):1198-1200 (1997).

(56) References Cited

OTHER PUBLICATIONS

Garcia, C. et al. "Size Dependence of Lifetime and Absorption Cross Section of Si Nanocrystals Embedded in $SiO_2$," *Appl. Phys. Lett.* 82(10):1595-1597 (2003).
Goossens, A. et al., "Sensitization of $TiO_2$ with p-type semiconductor polymers," *Chem. Phys. Lett.* 287:148 (1998).
Greene, J.E. et al., "Morphological and electrical properties of rf sputtered $Y_2O_3$-doped $ZrO_2$ thin films," *J. Vac. Sci. Tech.* 13(1):72-75 (1976).
Han, H.-S. et al. "Optical Gain at 1.54 µm in Erbium-Doped Silicon Nanocluster Sensitized Waveguide," *Appl. Phys. Lett.* 79(27):4568-4570 (2001).
Hayakawa, T. et al., "Enhanced fluorescence from $Eu^{3+}$ owing to surface plasma oscillation of silver particles in glass," *J. Non-Crystalline Solids* 259:16-22 (1999).
Hayakawa, T. et al, "Field enhancement effect of small Ag particles on the fluorescence from $Eu^{3+}$-doped $SiO_2$ glass," *Appl. Phys. Lett.* 74(11):1513-1515 (1999).
Hayfield, P.C.S., in: *Development of a New Material-Monolithic $Ti_4O_7$ Ebonix® Ceramic*, Royal Society of Chemistry, Cambridge, Table of Contents, 4 pages (2002).
Hehlen, M.P. et al. "Spectroscopic Properties of $Er^{3+}$- and $Yb^{3+}$-doped Soda-Lime Silicate and Aluminosilicate Glasses," *Physical Review B* 56(15):9302-9318 (1997).
Hehlen, M.P. et al. "Uniform Upconversion in High-Concentration $Er^{3+}$-doped Soda Lime Silicate and Aluminosilicate Glasses," *Optics Letters* 22(11):772-774 (1997).
Horst, F. et al., "Compact, Tunable Optical Devices in Silicon-Oxynitride Waveguide Technology," *Top. Meeting Integrated Photonics Res. '00*, Quebec, Canada, p. IThF1, 3 pages (2000).
Howson, R.P., "The reactive sputtering of oxides and nitrides," *Pure & Appl. Chem.* 66(6):1311-1318 (1994).
Hubner, J. and Guldberg-Kjaer, S., "Planar Er-and Yb-Doped Amplifiers and Lasers," COM Technical University of Denmark, 10th European Conf. On Integrated Optics, Session WeB2, pp. 71-74 (2001).
Hwang, M-S. et al., "The effect of pulsed magnetron sputtering on the properties of indium tin oxide thin films," *Surface and Coatings Tech.* 171:29-33 (2003).
Im, J.S. et al. "Controlled Super-Lateral Growth of Si Films for Microstructural Manipulation and Optimization," *Physica Status Solidi (A)* 166(2):603-617 (1998).
Im, J.S. and Sposili, R.S., "Crystalline Si Films for Integrated Active-Matrix Liquid Crystal Displays," *MRS Bulletin*, pp. 39-48 (1996).
Im, J.S. et al., "Single-crystal Si films for thin-film transistor devices," *Appl. Physics Lett.* 70(25):3434-3436 (1997).
Itoh, M. et al., "Large reduction of singlemode-fibre coupling loss in 1.5% Δ planar lightwave circuits using spot-size converters," *Electronics Letters* 38(2):72-74 (2002).
Jackson, M.K. and Movassaghi, M., "An Accurate Compact EDFA Model," Eur. Conf. Optical Comm., Munich, Germany, 2 pages (2000).
Janssen, R. et al. "Photoinduced electron transfer from conjugated polymers onto nanocrystalline $TiO_2$," *Synthet. Metal.*, 1 page (1999).
Johnson, J.E. et al., "Monolithically Integrated Semiconductor Optical Amplifier and Electroabsorption Modulator with Dual-Waveguide Spot-Size Converter Input," *IEEE J. Selected Topics in Quantum Electronics* 6(1):19-25 (2000).
Jonsson L.B. et al. "Frequency response in pulsed DC reactive sputtering processes," *Thin Solid Films* 365:43-48 (2000).
Kato, K. and Inoue, Y., "Recent progress on PLC hybrid integration," *SPIE.* 3631:28-36 (1999).
Kato, K. and Tohmori, Y., "PLC Hybrid Integration Technology and Its Application to Photonic Components," *IEEE J. Selected Topics in Quantum Electronics* 6(1):4-13 (2000).
Kelly, P.J. et al., "Reactive pulsed magnetron sputtering process for alumina films," *J. Vac. Sci. Technol. A* 18(6):2890-2896 (2000).
Kelly, P.J. and Arnell, R.D., "Control of the structure and properties of aluminum oxide coatings deposited by pulsed magnetron sputtering," *J Vac. Sci. Technol. A* 17(3):945-953 (1999).
Kik, P.G. and Polman, A., "Gain Limiting Processes in Er-doped Si Nanocrystal Waveguides in $SiO_2$," *J. Appl. Phys.* 91(1):534-536 (2002).
Kim, H-K. et al., "Characteristics of rapid-thermal-annealed $LiCoO_2$ cathode film for an all-solid-state thin film microbattery," *J. Vac. Sci. Technol. A* 22(4):1182-1187 (2004).
Kim, J-Y. et al. "Frequency-dependent pulsed direct current magnetron sputtering of titanium oxide films," *J. Vac. Sci. Technol. A* 19(2):429-434 (2001).
Kim, D-W. et al. "Mixture Behavior and Microwave Dielectric Properties in the Low-fired $TiO_2$-CuO System," *Jpn. J. Appl. Phys.* 39:2696-2700 (2000).
Ladouceur, F. and Love, J.D., in: *Silica-based Buried Channel Waveguides and Devices*, Chapman & Hall, London, Table of Contents, 6 pages (1996).
Ladouceur, F. et al., "Effect of side wall roughness in buried channel waveguides," *IEEE Proc. Optoelectron.* 141(4):242-248 (1994).
Lamb, W.B., "Designing Nonfoil Containing Skins for VIP Applications," DuPont VIA Symposium Presentation, 35 pages (1999).
Lamb, W. and Zeiler, R., "Designing Non-Foil Containing Skins for Vacuum Insulation Panel (VIP) Applications," *Vuoto XXVIII*(1-2):55-58 (1999).
Lange, M.R. et al., "High Gain Ultra-Short Length Phosphate glass Erbium-Doped Fiber Amplifier Material," OSA Optical Fiber Communications (OFC), 3 pages (2002).
Laporta, P. et al, "Diode-pumped cw bulk Er:Yb:glass laser," *Optics Letters* 16(24):1952-1954 (1991).
Laurent-Lund, C. et al., "PECVD Grown Multiple Core Planar Waveguides with Extremely Low Interface Reflections and Losses," *IEEE Photonics Tech. Lett.* 10(10):1431-1433 (1998).
Lee, K.K. et al., "Effect of size and roughness on light transmission in a $Si/SiO_2$ waveguide: Experiments and model," *Appl. Phys. Lett.* 77(11):1617-1619 (2000).
Lee, B.H. et al., "Effects of interfacial layer growth on the electrical characteristics of thin titanium oxide films on silicon," *Appl. Phys. Lett.* 74(21):3143-3145 (1999).
Love, J.D. et al., "Quantifying Loss Minimisation in Single-Mode Fibre Tapers," *Electronics Letters* 22(17):912-914 (1986).
Mardare, D. and Rusu, G.I., "On the structure of Titanium Oxide Thin Films," *Analele Stiintifice Ale Universitatii IASI*, Romania, pp. 201-208 (1999).
Marques, P.V.S. et al., "Planar Silica-on-Silicon Waveguide Lasers Based in Two Layer Core Devices," 10th European Conference on Integrated Optics, Session WeB2, pp. 79-82 (2001).
Meijerink, A. et al., "Luminescence of $Ag^+$ in Crystalline and Glassy $SrB_4O_7$," *J. Physics Chem. Solids* 54(8):901-906 (1993).
Mesnaoui, M. et al, "Spectroscopic properties of $Ag^+$ ions in phosphate glasses of $NaPO_3$- $AgPO_3$ system," *Eur. J. Solid State Inorg. Chem.* 29:1001-1013 (1992).
Mitomi, O. et al., "Design of a Single-Mode Tapered Waveguide for Low-Loss Chip-to-Fiber Coupling," *IEEE J. Quantum Electronics* 30(8):1787-1793 (1994).
Mizuno, Y. et al. "Temperature dependence of oxide decomposition on titanium surfaces in UHV," *J. Vac. Sci. & Tech. A* 20(5):1716-1721 (2002).
Ohkubo, H. et al., "Polarization-Insensitive Arrayed-Waveguide Grating Using Pure $SiO_2$ Cladding," Fifth Optoelectronics and Communication Conference (OECC 2000) Technical Digest, pp. 366-367 (2000).
Ohmi, S. et al., "Rare earth metal oxides for high-K gate insulator," VLSI Design 2004, 1 page (2004).
Ohtsuki, T. et al., "Gain Characteristics of a high concentration $Er^{3+}$-doped phosphate glass waveguide," *J. Appl. Phys.* 78(6):3617-3621 (1995).
Ono, H. et al., "Design of a Low-loss Y-branch Optical Waveguide," Fifth Optoelectronic and Communications Conference (OECC 2000) Technical Digest, pp. 502-503 (2000).
Padmini, P. et al. "Realization of High Tunability Barium Strontium Titanate Thin Films by rf Magnetron Sputtering," *Appl. Phys. Lett.* 75(20):3186-3188 (1999).
Pan, T. et al., "Planar $Er^{3+}$-doped aluminosilicate waveguide amplifier with more than 10 dB gain across C-band," Optical Society of America, 3 pages (2000).

(56) References Cited

OTHER PUBLICATIONS

Peters, D.P. et al., "Formation mechanism of silver nanocrystals made by ion irradiation of $Na^+ \leftrightarrows Ag^+$ ion-exchanged sodalime silicate glass," *Nuclear Instruments and Methods in Physics Research B* 168:237-244 (2000).
Rajarajan, M. et al., "Numerical Study of Spot-Size Expanders for an Efficient OEIC to SMF Coupling," *IEEE Photonics Technology Letters* 10(8):1082-1084 (1998).
Ramaswamy, R.V. et al., "Ion-Exchanged Glass Waveguides: a Review," *J. Lightwave Technology* 6(6):984-1002 (1988).
Roberts, S.W. et al., "The Photoluminescence of Erbium-doped Silicon Monoxide," University of Southampton, Department of Electronics and Computer Science Research Journal, 7 pages (1996).
Sanyo Vacuum Industries Co., Ltd. Products Info, $TiO_2$, (2003), 1 page http://www.sanyovac.co.jp/Englishweb/products/ETiO2.htm.
Schermer, R. et al., "Investigation of Mesa Dielectric Waveguides," Proceedings of the OSA Integrated Photonics Research Topical Meeting and Exhibit, Paper No. IWB3, 3 pages (2001).
Schiller, S. et al. "PVD Coating of Plastic Webs and Sheets with High Rates on Large Areas," European Materials Research Society 1999 Spring Meeting, Jun. 1-4, 1999, Strasbourg, France, 13 pages (1999).
Second International Symposium of Polymer Surface Modification: Relevance to Adhesion, Preliminary Program, 13 pages (1999).
Seventh International Conference on $TiO_2$ Photocatalysis: Fundamentals & Applications, Toronto, Ontario, Canada, Final Program, 7 pages (Nov. 17-21, 2002).
Sewell, P. et al., "Rib Waveguide Spot-Size Transformers: Modal Properties," *J. Lightwave Technology* 17(5):848-856 (1999).
Shaw, D.G. et al., "Use of Vapor Deposited Acrylate Coatings to Improve the Barrier Properties of Metallized Film," Society of Vacuum Coaters, 37th Annual Technical Conference Proceedings, pp. 240-244 (1994).
Shin, J.C. et al. "Dielectric and Electrical Properties of Sputter Grown $(Ba,Sr)TiO_3$ Thin Films," *J. Appl. Phys.* 86(1):506-513 (1999).
Shmulovich, J. et al., "Recent progress in Erbium-doped waveguide amplifiers," Bell Laboratories, pp. 35-37 (1999).
Slooff, L.H. et al, "Optical properties of Erbium-doped organic polydentate cage complexes," *J. Appl. Phys.* 83(1):497-503 (1998).
Smith, R.E. et al., "Reduced Coupling Loss Using a Tapered-Rib Adiabatic-Following Fiber Coupler," *IEEE Photonics Technology Lett.* 8(8):1052-1054 (1996).
Strohhofer, C. and Polman, A. "Energy transfer to $Er^{3+}$ in Ag ion-exchanged glass," FOM Institute for Atomic and Molecular Physics, 10 pages (2001).
Sugiyama, A. et al., "Gas Permeation Through the Pinholes of Plastic Film Laminated with Aluminium Foil," *Vuoto* XXVIII(1-2):51-54 (1999).
Tervonen, A., "Challenges and opportunities for integrated optics in optical networks," *SPIE* 3620:2-11 (1999).
Ting, C.Y. et al., "Study of planarized sputter-deposited $SiO_2$," *J. Vac. Sci. Technol*, 15(3):1105-1112 (1978).
Treichel, O. and Kirchhoff, V., "The influence of pulsed magnetron sputtering on topography and crystallinity of $TiO_2$ films on glass," *Surface and Coatings Technology* 123:268-272 (2000).
Tukamoto, H. and West, A.R., "Electronic Conductivity of $LiCoO_2$ and Its Enhancement by Magnesium Doping," *J. Electrochem. Soc.* 144(9):3164-3168 (1997).
Van Dover, R.B., "Amorphous Lanthanide-Doped $TiO_x$ Dielectric Films," *Appl. Phys. Lett.* 74(20):3041-3043 (1999).
Viljanen, J. and Leppihalme, M., "Planar Optical Coupling Elements for Multimode Fibers with Two-Step Ion Migration Process," *Applied Physics* 24(1):61-63 (1981).
Villegas, M.A. et al., "Optical spectroscopy of a soda lime glass exchanged with silver," *Phys. Chem. Glasses* 37(6):248-253 (1996).
Von Rottkay, K. et al., "Influence of stoichiometry on electrochromic cerium-titanium oxide compounds," Presented at the 11th Int'l. Conference of Solid State Ionics, Honolulu, Hawaii, Nov. 19, 1997, Published in *Solid State Ionics* 113-115:425-430. (1998).
Westlinder, J. et al., "Simulation and Dielectric Characterization of Reactive dc Magnetron Cosputtered $(Ta_2O_5)_{1-x}(TiO_2)_x$ Thin Films," *J. Vac. Sci. Technol. B* 20(3):855-861 (May/Jun. 2002).
Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).
Yanagawa, H. et al., "Index-and-Dimensional Taper and Its Application to Photonic Devices," *J. Lightwave Technology* 10(5):587-591 (1992).
Yoshikawa, K. et al., "Spray formed aluminum alloys for sputtering targets," *Powder Metallurgy* 43(3):198-199 (2000).
Zhang, H. et al. "High Dielectric Strength, High k $TiO_2$ Films by Pulsed DC, Reactive Sputter Deposition," 5 pages (2001).
Office Action issued on Sep. 27, 2004 in U.S. Appl. No. 10/291,179.
Response to Office Action filed on Mar. 14, 2005 in U.S. Appl. No. 10/291,179.
Office Action issued on Jun. 15, 2005 in U.S. Appl. No. 10/291,179.
Response to Office Action filed on Oct. 17, 2005 in U.S. Appl. No. 10/291,179.
Office Action issued on May 2, 2002 in U.S. Patent No. 6,533,907.
Response to Office Action filed on Sep. 3, 2002 in U.S. Patent No. 6,533,907.
Office Action issued on Feb. 12, 2004 in U.S. Appl. No. 09/903,081.
Response to Office Action filed on Aug. 10, 2004 in U.S. Appl. No. 09/903,081.
Office Action issued on Sep. 10, 2004 in U.S. Appl. No. 09/903,081.
Amendment/RCE filed on Mar. 10, 2005 in U.S. Appl. No. 09/903,081.
Office Action issued on Mar. 17, 2005 in U.S. Appl. No. 09/903,081.
Response to Office Action filed on Jun. 17, 2005 in U.S. Appl. No. 09/903,081.
Office Action issued on Jul. 8, 2005 in U.S. Appl. No. 09/903,081.
Office Action issued on Nov. 28, 2005 in U.S. Appl. No. 09/903,081.
Office Action issued on May 14, 2003 in U.S. Appl. No. 10/101,492.
Response to Office Action filed on Aug. 14, 2003 in U.S. Appl. No. 10/101,492.
Office Action issued on Sep. 3, 2003 in U.S. Appl. No. 10/101,492.
Response to Office Action filed on Mar. 3, 2004 in U.S. Appl. No. 10/101,492.
Office Action issued Sep. 21, 2005 in U.S. Appl. No. 11/100,856.
Office Action issued on Feb. 24, 2004 in U.S. Appl. No. 10/101,863.
Response to Office Action filed on Jul. 23, 2004 in U.S. Appl. No. 10/101,863.
Office Action issued on Oct. 6, 2004 in U.S. Appl. No. 10/101,863.
Office Action dated Jan. 13, 2005, in U.S. Appl. No. 10/101,863.
Response to Office Action filed on Jun. 10, 2005 in U.S. Appl. No. 10/101,863.
Office Action issued on Aug. 4, 2005, in U.S. Appl. No. 10/101,863.
Response to Office Action filed Dec. 5, 2005, in U.S. Appl. No. 10/101,863.
Office Action dated Mar. 25, 2005, received in U.S. Appl. No. 10/954,182.
Response Office Action filed on Jul. 25, 2005 in U.S. Appl. No. 10/954,182.
Office Action issued on Oct. 25, 2005, in U.S. Appl. No. 10/954,182.
Office Action issued on Oct. 22, 2003 in U.S. Appl. No. 10/101,341.
Response to Office Action filed on Feb. 23, 2004 in U.S. Appl. No. 10/101,341.
Office Action issued on Jun. 10, 2004 in U.S. Appl. No. 10/101,341.
Response to Office Action filed on Dec. 8, 2004 in U.S. Appl. No. 10/101,341.
Office Action issued on Aug. 8, 2005 in U.S. Appl. No. 10/101,341.
Response to Office Action filed on Nov. 8, 2005 in U.S. Appl. No. 10/101,341.
Office Action issued on May 4, 2004 in U.S. Appl. No. 10/101,493.
Office Action issued on Oct. 3, 2005 in U.S. Appl. No. 10/650,461.
Office Action issued on Mar. 14, 2005 in U.S. Appl. No. 10/789,953.
Office Action issued on Dec. 2, 2005 in U.S. Appl. No. 10/789,953.
Office Action issued on Mar. 24, 2005 in U.S. Appl. No. 10/851,542.
Response to Office Action dated Jul. 25, 2005 in U.S. Appl. No. 10/851,542.
Office Action issued on Oct. 19, 2005 in U.S. Appl. No. 10/851,542.

(56) References Cited

OTHER PUBLICATIONS

Lee, W.J. et al. "Optimizing indium tin oxide thin films with bipolar d.c.-pulsed magnetron sputtering for electrochromic device applications", J. Mater. Sci: Mat in Elec. 13:751-756 (2002).
Mientus, R. et al., "Reactive magnetron sputtering of tin-doped indium oxide (ITO): influence of argon pressure and plasma excitation mode", Surface and Coatings Tech. 142-144:748-754 (2001).
Response to Office Action dated Nov. 21, 2007, in U.S. Appl. No. 10/291,179.
Notice of Allowance dated Mar. 4, 2008, in U.S. Appl. No. 10/291,179.
Response to Final Office Action filed Oct. 2, 2007, in U.S. Appl. No. 10/101,863.
Office Action dated Nov. 15, 2007, in U.S. Appl. No. 10/101,863.
Response to Office Action dated Dec. 18, 2007, in U.S. Appl. No. 10/101,863.
Notice of Allowance dated Jan. 25, 2008, in U.S. Appl. No. 10/101,863.
Final Office Action dated Jul. 24, 2007, in U.S. Appl. No. 10/954,182.
Amendment/Rce filed Oct. 24, 2007, in U.S. Appl. No. 10/954,182.
Office Action dated Nov. 15, 2007, in U.S. Appl. No. 10/954,182.
Response to Office Action dated Dec. 18, 2007, in U.S. Appl. No. 10/954,182.
Notice of Allowance dated Feb. 1, 2008, in U.S. Appl. No. 10/954,182.
Office Action dated May 29, 2008, in U.S. Appl. No. 11/228,834.
Response to Office Action filed Sep. 29, 2008, in U.S. Appl. No. 11/228,834.
Notice of Allowance dated Dec. 30, 2008, in U.S. Appl. No. 11/228,834.
Supplemental Notice of Allowance dated Apr. 23, 2009, in U.S. Appl. No. 11/228,834.
Preliminary Amendment dated Mar. 11, 2008, in U.S. Appl. No. 11/228,717.
Notice of Allowance dated Apr. 2, 2008, in U.S. Appl. No. 11/228,717.
Supplemental Notice of Allowance dated Jul. 17, 2008, in U.S. Appl. No. 11/228,717.
Office Action dated Mar. 30, 2009, in U.S. Appl. No. 11/191,643.
Amendment and Response to Office Action filed Sep. 30, 2009, in U.S. Appl. No. 11/191,643.
Notice of Non-Compliant Amendment mailed Nov. 9, 2009, in U.S. Appl. No. 11/191,643.
Response to Notice of Non-Compliant Amendment filed Dec. 9, 2009, in U.S. Appl. No. 11/191,643.
Notice of Non-Compliant Amendment mailed Jan. 25, 2010, in U.S. Appl. No. 11/191,643.
Response to Notice of Non-Compliant Amendment filed Feb. 24, 2010, in U.S. Appl. No. 11/191,643.
Supplemental Notice of Allowance dated Jul. 5, 2007, in U.S. Appl. No. 11/228,805.
First Office Action dated Jul. 25, 2008 from the State Intellectual Property Office of People's Republic of China in Appl. No. 200480005515.5. Translation.
Response to First Office Action filed Feb. 9, 2009, with the State Intellectual Property Office of People's Republic of China in Appl. No. 200480005515.5. Translation.
Decision for Allowance for Registration dated Feb. 1, 2007, in Application No. 10-2005-7016055. Translation.
Certificate of Grant of Patent dated Sep. 28, 2007, in Application No. 200505388-9.
International Preliminary Report on Patentability dated Sep. 15, 2005, in PCT/US2004/005531.
Office Action mailed Mar. 2, 2010, in U.S. Appl. No. 11/726,972.
First Office Action dated Dec. 5, 2008, from the State Intellectual Property Office of People's Republic of China in Appl. No. 200480021078.6.
Response to first Office Action filed Jun. 18, 2009, with the State Intellectual Property Office of P.R.C., in Appl. No. CN200480021078.6.
Second Office Action dated Aug. 14, 2009, from the State Intellectual Property Office of P.R.C., in Appl. No. CN200480021078.6.
Response to second Office Action filed Dec. 29, 2009, with the State Intellectual Property Office of People's Republic of China in Appl. No. 200480021078.6.
Rejection Decision mailed Feb. 5, 2010, from the State Intellectual Property Office of P.R.C., in Appl. No. 200480021078.6.
Office Action dated Feb. 15, 2008, in U.S. Appl. No. 10/850,968.
Response to Office Action filed Jun. 16, 2008, in U.S. Appl. No. 10/850,968.
Supplemental Amendment filed Jun. 27, 2008, in U.S. Appl. No. 10/850,968.
Final Office Action dated Oct. 15, 2008, in U.S. Appl. No. 10/850,968.
Supplemental Final Office Action dated Dec. 5, 2008, in U.S. Appl. No. 10/850,968.
Amendment After Final filed Apr. 15, 2009, in U.S. Appl. No. 10/850,968.
Office Action mailed Apr. 30, 2009, in U.S. Appl. No. 10/850,968.
Amendment in Response to Office Action filed Oct. 28, 2009, in U.S. Appl. No. 10/850,968.
Final Office Action mailed Feb. 26, 2010, in U.S. Appl. No. 10/850,968.
Supplemental Final Office Action mailed Apr. 21, 2010, in U.S. Appl. No. 10/850,968.
First Office Action dated Jun. 27, 2008 from the State Intellectual Property Office of People's Republic of China in Appl. No. 200480020874.8.
Response to First Office Action filed Jan. 12, 2009, with the State Intellectual Property Office of People's Republic of China in Appl. No. 200480020874.8.
Second Office Action dated Aug. 14, 2009, from the State Intellectual Property Office of P.R.C. in Appl. No. 200480020874.8.
Response to second Office Action filed Dec. 29, 2009, with the State Intellectual Property Office of People's Republic of China in Appl. No. 200480020874.8.
First Office Action dated Jul. 18, 2008 from the State Intellectual Property Office of People's Republic of China in Appl. No. 200580042305.8.
Response to First Office Action filed Feb. 2, 2009, with the State Intellectual Property Office of People's Republic of China in Appl. No. 200580042305.8.
Second Office Action dated May 8, 2009, from the State Intellectual Property Office of People's Republic of China in Appl. No. 200580042305.8.
Response to Second Office Action filed Sep. 22, 2009, with the State Intellectual Property Office of P.R.C., in Appl. No. 200580042305.8.
Third Office Action dated Jan. 29, 2010, from the State Intellectual Property Office of People's Republic of China in Appl. No. 200580042305.8.
Examination Report dated Jul. 24, 2008, for EP Application No. 05853649.1.
Response to Examination Report filed Feb. 3, 2009, for EP Application No. 05853649.1.
Communication Under Rule 71(3) EPC—Intent to Grant dated May 27, 2009, in EP Appl. No. 05853649.1.
Office Action dated Nov. 5, 2008 from the Intellectual Property Office (IPO) in Appl. No. 94143175.
Response to Office Action filed May 5, 2009, with the Intellectual Property Office (IPO) in Appl. No. 94143175.
Written Primary Decision of Rejection dated Jan. 6, 2010, from the Intellectual Property Office (IPO) in Appl. No. 94143175.
International Preliminary Report on Patentability dated Jun. 21, 2007, in PCT/US05/044781.
Office Action dated Feb. 26, 2008, in U.S. Appl. No. 11/218,652.
Response to Office Action filed Jun. 30, 2008, in U.S. Appl. No. 11/218,652.
Final Office Action dated Oct. 30, 2008, in U.S. Appl. No. 11/218,652.
Amendment/Rce filed Apr. 30, 2009, in U.S. Appl. No. 11/218,652.
Office Action mailed Jul. 9, 2009, in U.S. Appl. No. 11/218,652.
Amendment in Response to Office Action filed Dec. 8, 2009, in U.S. Appl. No. 11/218,652.

(56) References Cited

OTHER PUBLICATIONS

Notice of Allowance mailed Feb. 23, 2010, in U.S. Appl. No. 11/218,652.
Written Opinion mailed Apr. 3, 2009, from the Australian Patent Office in SG Appl. No. 200801749-3.
Response to Written Opinion filed Dec. 11, 2009, with the Intellectual Property Office of Singapore, in SG Appl. No. 200801749-3.
PCT International Search Report and Written Opinion for Application No. PCT/US06/33315 mailed Feb. 28, 2008.
PCT International Preliminary Report on Patentability for Application No. PCT/US06/33315 mailed Mar. 19, 2009.
Final Office Action dated Apr. 27, 2010, in U.S. Appl. No. 11/191,643.
Amendment with RCE filed Jul. 26, 2010, in U.S. Appl. No. 11/191,643.
Office Action and IPO Search Report dated May 31, 2010, in Application No. 93114493.
Response to Office Action filed Aug. 30, 2010, in Application No. 93114493.
Amendment and Response to Office Action filed Jun. 2, 2010, in U.S. Appl. No. 11/726,972.
Final Office Action mailed Aug. 26, 2010, in U.S. Appl. No. 11/726,972.
Appeal to Rejection Decision with filing of Request for Re-Examination filed May 18, 2010, in Appl. No. 200480021078.6.
Amendment After Final filed Jul. 9, 2010, in U.S. Appl. No. 10/850,968.
Advisory Action mailed Jul. 29, 2010, in U.S. Appl. No. 10/850,968.
Supplemental Amendment After Final filed Aug. 23, 2010, in U.S. Appl. No. 10/850,968.
Office Action and IPO Search Report dated Aug. 10, 2010, in TW Appl. No. 93114518.
Response to Third Office Action filed Apr. 9, 2010, in Appl. No. 200580042305.8.
Notification of Grant of Invention Patent Right and Notification for Completion of Formalities for Registration issued Jun. 11, 2010, in Appl. No. 200580042305.8.
Office Action dated Apr. 22, 2010, in Korean Appl. No. 10-2007-7014536.
Response to Office Action filed Aug. 23, 2010, in Korean Appl. No. 10-2007-7014536.
Statement of Reasons for Re-Examination filed Jun. 29, 2010, in Appl. No. 94143175.
Notice of Allowance mailed Jul. 22, 2010, in U.S. Appl. No. 11/218,652.
Final Examination Report dated Mar. 25, 2010, in SG Appl. No. 200801749-3.
Certificate of Grant of Patent dated Aug. 31, 2010, in SG Appl. No. 200801749-3.
Abraham, K.M. et al., "Inorganic-organic composite solid polymer electrolytes," vol. 147(4) *J. Electrochem. Soc.*, pp. 1251-1256 (2000).
Abrahams, I., "$Li_6Zr_2O_7$, a new anion vacancy ccp based structure, determined by ab initio powder diffraction methods," vol. 104,*J. Solid State Chem.*, pp. 397-403 (1993).
Amatucci, G., et al., "Lithium scandium phosphate-based electrolytes for solid state lithium rechargeable microbatteries," *Solid State Ionics*, vol. 60, pp. 357-365 (1993).
Appetecchi, G.B., et al., "Composite polymer electrolytes with improved lithium metal electrode interfacial properties," vol. 145(12),*J. Electrochem. Soc.*, pp. 4126-4132 (1998), December.
Bates, J.B., et al., "Electrical properties of amorphous lithium electrolyte thin films,", 53-56 *Solid State Ionics*, pp. 647-654 (1992).
Bates et al., "Thin-Film Lithium Batteries", *New Trends in Electrochemical Technology: Energy Storage Systems for Electronics*, T. Osaka & M. Datta Eds. Gordon and Breach, 2000.

Delmas, C., et al., "Des conducteurs ioniques pseudo-bidimensionnels $Li_8MO_6$ (M=Zr, Sn), $Li_7LO_6$ (L=Nb, Ta) et $Li_6In_2O_6$," *Mat. Res. Bull.*, vol. 14, pp. 619-625 (1979).
Hu, Y.-W., et al., "Ionic conductivity of lithium phosphate-doped lithium orthosilicate," *Mat. Res. Bull.*, vol. 11, pp. 1227-1230 (1976), June.
Jones et al., "A Thin Film Solid State Microbattery," *Solid State Ionics*, vol. 628, pp. 53-56 (1992).
Mattox, *Handbook of Physical Vapor Deposition (PVD) Processing*, Society of Vacuum Coaters, Albuquerque, New Mexico 660f and 692ff, Noyes Publications (1998).
Neudecker, B., et al., "$Li_9SiAlO_8$: a lithium ion electrolyte for voltages above 5.4 V," *Electrochem. Soc.*, vol. 143(7), pp. 2198-2203 (1996), July.
Ohno, H., et al., "Electrical conductivity of a sintered pellet of octalithium zirconate," *J. Nucl. Mat.*, vol. 132, p. 222-230 (1985), March.
Sarro, P., "Silicon Carbide as a New MEMS Technology," *Sensors and Actuators*, vol. 82, pp. 210-218 (2000).
Scholder, V., et al., "Über Zirkonate, Hafnate und Thorate von Barium, Strontium, Lithium und Natrium," *Zeitschrift für Anorganische und Allgemeine Chemie*, Band 362, pp. 149-168 (1968).
Wang, B., et al., "Characterization of Thin-Film Rechargeable Lithium Batteries with Lithium Cobalt Oxide Cathodes", *J. Electrochem. Soc.*, vol. 143, pp. 3203-3213 (1996), October.
Yu, X., et al., "A stable thin-film lithium electrolyte: lithium phosphorous oxynitride," *J. Electrochem. Soc.*, vol. 144(2), pp. 524-532 (1997), February.
International Search Report mailed Feb. 14, 2008, in related International Application No. PCT/US06/46370.
First Examination Report dated Sep. 2, 2010, in European Patent Appl. No. 04715009.9.
Allowance Decision of Examination dated Sep. 17, 2010, in Taiwan Application No. 93114493.
Amendment After Final filed Oct. 26, 2010, in U.S. Appl. No. 11/726,972.
Advisory Action mailed Nov. 3, 2010, in U.S. Appl. No. 11/726,972.
Response to Office Action filed Nov. 11, 2010, in Taiwan Appl. No. 93114518.
Allowance Decision of Examination dated Dec. 13, 2010, in Taiwan Appl. No. 93114518.
Decision for Allowance of Registration dated Dec. 8, 2010, in Korean Appl. No. 10-2007-7014536.
Office Action dated Dec. 29, 2010, in Taiwan Appl. No. 94143175.
Office Action mailed Feb. 8, 2010, in related U.S. Appl. No. 11/557,383.
Amendment and Response to Final Office Action filed May 10, 2010, in related U.S. Appl. No. 11/557,383.
Final Office Action mailed Aug. 2, 2010, in related U.S. Appl. No. 11/557,383.
Response to Final Office Action filed Oct. 4, 2010, in related U.S. Appl. No. 11/557,383.
Advisory Action mailed Oct. 22, 2010, in related U.S. Appl. No. 11/557,383.
Response to Final Office Action filed Nov. 29, 2010, in related U.S. Appl. No. 11/557,383.
Notice of Allowance mailed Jan. 20, 2011, in related U.S. Appl. No. 11/557,383.
Office Action mailed Feb. 16, 2011, in U.S. Appl. No. 11/191,643.
Extended European Search Report and Search Opinion mailed Jan. 12, 2011, in European Appl. No. 06790009.2.
Bouwman et al., "Influence of Diffusion Plane Orientation on Electrochemical Properties of Thin Film $LiCoO_2$ Electrodes", Journal of The Electrochemical Society, 149 (6) A699-A709 (2002).
Kim et al., "Electrochemical Stability of Thin-Film $LiCoO_2$ Cathodes by Aluminum-Oxide Coating", Chem. Mater., 15, 1505-1511 (2003).

\* cited by examiner

| CURRENT COLLECTOR | |
|---|---|
| ⋮ | |
| CURRENT COLLECTOR | 603 |
| LiCoO₂ | 602 |
| LiPON | 901 |
| ANODE | 902 |
| CURRENT COLLECTOR | 903 |
| ANODE | 902 |
| LiPON | 901 |
| LiCoO₂ | 602 |
| CURRENT COLLECTOR | 603 |
| SUBSTRATE | 601 |

FIG. 9A

| CURRENT COLLECTOR | 603 |
|---|---|
| ⋮ | |
| CURRENT COLLECTOR | 903 |
| ANODE | 902 |
| LiPON | 607 |
| LiCoO₂ | 602 |
| CURRENT COLLECTOR | 903 |
| ANODE | 902 |
| LiPON | 901 |
| LiCoO₂ | 602 |
| CURRENT COLLECTOR | 603 |
| SUBSTRATE | 601 |

FIG. 9B

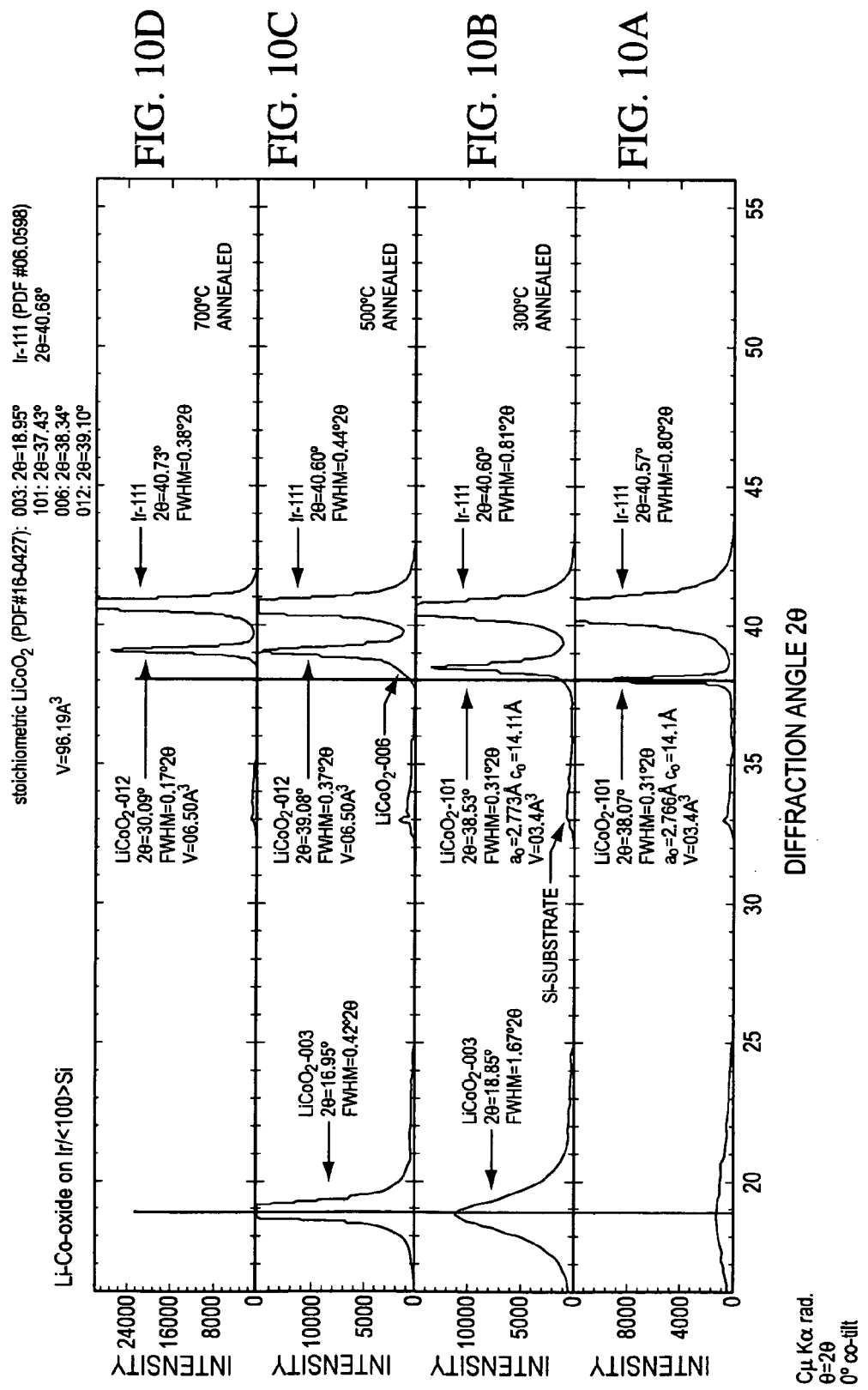

DEPOSITION OF LICOO₂

RELATED APPLICATION

The present application claims priority to Provisional Application No. 60/651,363, filed on Feb. 8, 2005, by Hongmei Zhang and Richard E. Demaray, and to Provisional Application No. 60/634,818, filed on Dec. 8, 2004, by the same inventors, each of which is herein incorporated by reference in its entirety.

BACKGROUND

1. Field of the Invention

The present invention is related to thin-film solid-state batteries and, in particular, the deposition of $LiCoO_2$ films and layers for battery manufacture.

2. Discussion of Related Art

Solid-state thin-film batteries are typically formed by stacking thin films on a substrate in such a way that the films cooperate to generate a voltage. The thin films typically include current collectors, a cathode, an anode, and an electrolyte. The thin films can be deposited utilizing a number of deposition processes, including sputtering and electroplating. Substrates suitable for this application have conventionally been high temperature materials capable of withstanding at least one high temperature anneal process to at least 700° C. for up to about 2 hours in air so as to crystallize the $LiCoO_2$ film. Such a substrate can be any suitable material with appropriate structural and material properties, for example a semiconductor wafer, metallic sheet (e.g., titanium or zirconium), ceramic such as alumina, or other material capable of withstanding subsequent high temperature processing in the presence of the $LiCoO_2$, which can experience significant interfacial reactions with most materials utilized in a battery during these temperature cycles.

Other lithium containing mixed metal oxides besides $LiCoO_2$, including Ni, Nb, Mn, V, and sometimes also Co, but including other transition metal oxides, have been evaluated as crystalline energy storage cathode materials. Typically, the cathode material is deposited in amorphous form and then the material is heated in an anneal process to form the crystalline material. In $LiCoO_2$, for example, an anneal at or above 700° C. transforms the deposited amorphous film to a crystalline form. Such a high temperature anneal, however, severely limits the materials that can be utilized as the substrate, induces destructive reaction with the lithium containing cathode material and often requires the use of expensive noble metals such as gold. Such high thermal budget processes (i.e., high temperatures for extended periods of time) are incompatible with semiconductor or MEM device processing and limit the choice of substrate materials, increase the cost, and decrease the yield of such batteries.

It is known that crystallization of amorphous $LiCoO_2$ on precious metals can be achieved. An example of this crystallization is discussed in Kim et al., where a conventional furnace anneal at 700° C. for 20 minutes of an amorphous layer of $LiCoO_2$ on a precious metal achieves crystallization of the $LiCoO_2$ material, as shown by x-ray diffraction data. Kim, Han-Ki and Yoon, Young Soo, "Characteristics of rapid-thermal-annealed $LiCoO_2$ cathode film for an all-solid-state thin film microbattery," J. Vac. Sci. Techn. A 22(4), July/August 2004. In Kim et al., the $LiCoO_2$ film was deposited on a platinum film that was deposited on a high-temperature MgO/Si substrate. In Kim et al, it was shown that such a crystalline film is capable of constituting the Li+ ion containing cathode layer of a functional all solid-state Li+ ion battery.

There are many references that disclose an ion beam assisted process that can provide a $LiCoO_2$ film that demonstrates some observable crystalline composition by low angle x-ray diffraction (XRD). Some examples of these are found in U.S. patent application Ser. Nos. 09/815,983 (Publication No. US 2002/001747), 09/815,621 (Publication No. US 2001/0032666), and 09/815,919 (Publication No. US 2002/0001746). These references disclose the use of a second front side ion beam or other ion source side-by-side with a deposition source so as to obtain a region of overlap of the flux of ions with the flux of $LiCoO_2$ vapor at the substrate surface. None of these references disclose film temperature data or other temperature data of the film during deposition to support an assertion of low temperature processing.

It is very difficult to form a uniform deposition either by sputtering a material layer or by bombardment with an ion flux. Utilization of two uniform simultaneous distributions from two sources that do not occupy the same position and extent with respect to the substrate enormously increases the difficulties involved in achieving a uniform material deposition. These references do not disclose a uniform materials deposition, which is required for reliable production of thin-film batteries. A well understood specification for material uniformity for useful battery products is that a 5% one-sigma material uniformity is standard in thin film manufacturing. About 86% of the films with this uniformity will be found acceptable for battery production.

It is even more difficult to scale a substrate to manufacturing scale, such as 200 mm or 300 mm. Indeed, in the references discussed above that utilize both a sputtering deposition and an ion beam deposition, only small area targets and small area substrates are disclosed. These references disclose a single feasibility result. No method for achieving a uniform distribution from two separate front side sources has been disclosed in these references.

Further, conventional materials and production processes can limit the energy density capacity of the batteries produced, causing a need for more batteries occupying more volume. It is specifically desirable to produce batteries that have large amounts of stored energy per unit volume in order to provide batteries of low weight and low volume.

Therefore, there is a need for a low temperature process for depositing crystalline material, for example $LiCoO_2$ material, onto a substrate. In particular, there is a need for processes that allow production of cathodic lithium films for a battery structure with a low enough thermal budget to allow production of functional structures on low temperature materials such as stainless steel, aluminum, or copper foil.

SUMMARY

In accordance with the present invention, deposition of $LiCoO_2$ layers in a pulsed-dc physical vapor deposition process is presented. Such a deposition can provide a low-temperature, high deposition rate deposition of a crystalline layer of $LiCoO_2$ with a desired <101> orientation. Some embodiments of the deposition address the need for high rate deposition of $LiCoO_2$ films, which can be utilized as the cathode layer in a solid state rechargeable Li battery. Embodiments of the process according to the present invention can eliminate the high temperature (>700° C.) anneal step that is conventionally needed to crystallize the $LiCoO_2$ layer.

A method of depositing a $LiCoO_2$ layer according to some embodiments of the present invention includes placing a substrate in a reactor; flowing a gaseous mixture including argon and oxygen through the reactor; and applying pulsed-DC power to a target formed of $LiCoO_2$ positioned opposite the substrate. In some embodiments, a $LiCoO_2$ layer is formed on the substrate. Further, in some embodiments the $LiCoO_2$ layer is a crystalline layer of orientation <101>.

In some embodiments, a stacked battery structure can be formed. The stacked battery structure includes one or more battery stacks deposited on a thin substrate, wherein each battery stack includes: a conducting layer, a crystalline $LiCoO_2$ layer deposited over the conducting layer, a LiPON layer deposited over the $LiCoO_2$ layer; and an anode deposited over the LiPON layer. A top conducting layer can be deposited over the one or more battery stacks.

In some embodiments, a battery structure can be formed in a cluster tool. A method of producing a battery in a cluster tool includes loading a substrate into a cluster tool; depositing a conducting layer over the substrate in a first chamber of the cluster tool; depositing a crystalline $LiCoO_2$ layer over the conducting layer in a second chamber of the cluster tool; depositing a LiPON layer over the $LiCoO_2$ layer in a third chamber of the cluster tool; depositing an anode layer over the $LiCoO_2$ layer in a fourth chamber; and depositing a second conducting layer over the LiPON layer in a fifth chamber of the cluster tool.

A fixture for holding a thin substrate can include a top portion and a bottom portion, wherein the thin substrate is held when the top portion is attached to the bottom portion.

These and other embodiments of the invention are further discussed below with reference to the following figures. It is to be understood that both the foregoing general description and the following detailed description are exemplary and explanatory only and are not restrictive of the invention, as claimed. Further, specific explanations or theories regarding the deposition or performance of certain layers during deposition processes or in the performance of devices incorporating those layers are presented for explanation only and are not to be considered limiting with respect to the scope of the present disclosure or the claims.

BRIEF DESCRIPTION OF THE DRAWINGS

FIGS. 9A and 9B illustrate examples of stacked batter structures with $LiCoO_2$ layers deposited according to some embodiments of the present invention.

FIGS. 10A through 10D illustrate deposition and anneal steps for $LiCoO_2$ deposited over an iridium layer on a silicon wafer.

Figure 1A:
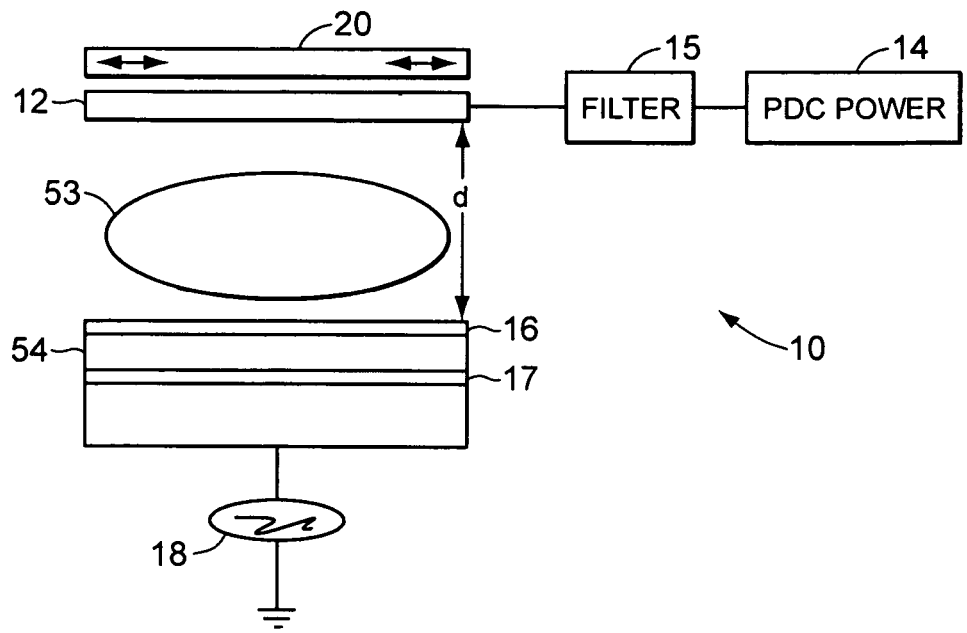
FIGS. 1A and 1B illustrate a pulsed-DC biased reactive deposition apparatus that can be utilized in the methods of depositing according to the present invention.

In the figures, elements having the same designation have the same or similar functions.

DETAILED DESCRIPTION

In accordance with embodiments of the present invention, $LiCoO_2$ films are deposited on a substrate by a pulsed-dc physical vapor deposition (PVD) process. In contrast to, for example, Kim et al., $LiCoO_2$ films according to some embodiments of the present invention provide a crystalline $LiCoO_2$ film as deposited on a substrate at a substrate temperature as low as about 220° C. during deposition, without the use of a metallic nucleation or barrier underlying film. The as-deposited crystalline $LiCoO_2$ films can be easily ripened to very high crystalline condition by anneal. In addition, the as deposited crystalline films, when positioned on a noble metal film can be annealed at much further reduced temperatures, for example as low as 400 to 500° C. instead of 700° C., providing for deposition, annealing, and production of solid state batteries on lower temperature substrates.

In the present application, a single, extended source is described which has been scaled to 400 mm×500 mm for production achieving a high $LiCoO_2$ uniformity at a deposition rate of 1.2 microns thickness an hour over an area of 2000 $cm^2$, without the need for secondary front side ion source or ion assistance.

On other depositions utilizing this process, a temperature measurement of the substrate during deposition showed that the substrate remained at less than 224° C. Temperature measurements were performed utilizing a temperature sticker purchased from Omega Engineering, Stamford, Conn. (Model no. TL-F-390, active from 199-224° C.).

Moreover, in some embodiments, films deposited according to the present invention can have a deposition rate of from about 10 to about 30 times higher than processes in conventional films. Deposition thicknesses and times of deposition for films deposited according to the present invention are illustrated in Table I. Furthermore, films according to the present invention can be deposited on wide area substrates having a surface area from 10 to 50 times the surface area of prior sputtering processes, resulting in much higher productivity and much lower cost of manufacture, thereby providing high-volume, low-cost batteries.

Further, conventional deposition processes without ion sources are capable of depositing amorphous $LiCoO_2$ layers, but do not deposit crystalline $LiCoO_2$ layers. Surprisingly, depositions according to some embodiment of the present invention, deposit a $LiCoO_2$ layer with substantial crystallinity readily measured by x-ray diffraction techniques. In some embodiments, the crystallinity of the as-deposited $LiCoO_2$ layers is sufficient to be utilized in a battery structure with no further thermal processing. In some embodiments, crystallinity of the as-deposited $LiCoO_2$ layers are improved by thermal processes with low thermal budgets, which can be compatible with films deposited on low-temperature substrates.

Further, as-deposited the stoichiometry of some $LiCoO_2$ layers deposited according to some embodiments of the present invention shows that this layer is sufficient for utilization in a battery. With the demonstrated ability to deposit a $LiCoO_2$ film with crystallinity and with sufficient stoichiometry, a battery utilizing as-deposited $LiCoO_2$ films can be produced. Heat treating the $LiCoO_2$ layers may improve the crystallinity and lower the impedance.

In some embodiments, a crystalline layer of $LiCoO_2$ with a <101> or a <003> crystalline orientation is deposited directly on the substrate. Deposition of crystalline material can eliminate or lessen the need of a subsequent high temperature anneal or precious-metal layers to crystallize and orient the film. Removing the high temperature anneal allows for formation of battery structures on light-weight and low temperature substrates such as stainless steel foil, copper foil, aluminum foil, and plastic sheet, reducing both the weight and the cost of batteries while retaining the energy density storage capabilities of Li-based batteries. In some embodiments, a crystalline $LiCoO_2$ layer can be deposited on a precious metal layer, such as iridium, resulting in a further significant lowering of the ripening thermal budget required to improve crystallinity.

Deposition of materials by pulsed-DC biased reactive ion deposition is described in U.S. patent application Ser. No. 10/101,863, entitled "Biased Pulse DC Reactive Sputtering of Oxide Films," to Hongmei Zhang, et al., filed on Mar. 16, 2002. Preparation of targets is described in U.S. patent application Ser. No. 10/101,341, entitled "Rare-Earth Pre-Alloyed PVD Targets for Dielectric Planar Applications," to Vassiliki Milonopoulou, et al., filed on Mar. 16, 2002. U.S. patent application Ser. No. 10/101,863 and U.S. patent application Ser. No. 10/101,341 are each assigned to the same assignee as is the present disclosure and each is incorporated herein in their entirety. Deposition of oxide materials has also been described in U.S. Pat. No. 6,506,289, which is also herein incorporated by reference in its entirety. Transparent oxide films can be deposited utilizing processes similar to those specifically described in U.S. Pat. No. 6,506,289 and U.S. application Ser. No. 10/101,863.

FIG. 1A shows a schematic of a reactor apparatus 10 for sputtering material from a target 12 according to the present invention. In some embodiments, apparatus 10 may, for example, be adapted from an AKT-1600 PVD (400×500 mm substrate size) system from Applied Komatsu or an AKT-4300 (600×720 mm substrate size) system from Applied Komatsu, Santa Clara, Calif. The AKT-1600 reactor, for example, has three deposition chambers connected by a vacuum transport chamber. These AKT reactors can be modified such that pulsed DC power is supplied to the target and RF power is supplied to the substrate during deposition of a material film.

Apparatus 10 includes target 12 which is electrically coupled through a filter 15 to a pulsed DC power supply 14. In some embodiments, target 12 is a wide area sputter source target, which provides material to be deposited on a substrate 16. Substrate 16 is positioned parallel to and opposite target 12. Target 12 functions as a cathode when power is applied to it from the pulsed DC power supply 14 and is equivalently termed a cathode. Application of power to target 12 creates a plasma 53. Substrate 16 is capacitively coupled to an electrode 17 through an insulator 54. Electrode 17 can be coupled to an RF power supply 18. A magnet 20 is scanned across the top of target 12.

For pulsed reactive dc magnetron sputtering, as performed by apparatus 10, the polarity of the power supplied to target 12 by power supply 14 oscillates between negative and positive potentials. During the positive period, the insulating layer on the surface of target 12 is discharged and arcing is prevented. To obtain arc free deposition, the pulsing frequency exceeds a critical frequency that can depend on target material, cathode current and reverse time. High quality oxide films can be made using reactive pulse DC magnetron sputtering as shown in apparatus 10.

Pulsed DC power supply 14 can be any pulsed DC power supply, for example an AE Pinnacle plus 10K by Advanced Energy, Inc. With this DC power supply, up to 10 kW of pulsed DC power can be supplied at a frequency of between 0 and 350 kHz. The reverse voltage can be 10% of the negative target voltage. Utilization of other power supplies can lead to different power characteristics, frequency characteristics, and reverse voltage percentages. The reverse time on this embodiment of power supply 14 can be adjusted between 0 and 5 μs.

Filter 15 prevents the bias power from power supply 18 from coupling into pulsed DC power supply 14. In some embodiments, power supply 18 can be a 2 MHz RF power supply, for example a Nova-25 power supply made by ENI, Colorado Springs, Co.

In some embodiments, filter 15 can be a 2 MHz sinusoidal band rejection filter. In some embodiments, the band width of the filter can be approximately 100 kHz. Filter 15, therefore, prevents the 2 MHz power from the bias to substrate 16 from damaging power supply 14 and allow passage of the pulsed-dc power and frequency.

Pulsed DC deposited films are not fully dense and may have columnar structures. Columnar structures can be detrimental to thin film applications such as barrier films and dielectric films, where high density is important, due to the boundaries between the columns. The columns act to lower the dielectric strength of the material, but may provide diffusion paths for transport or diffusion of electrical current, ionic current, gas, or other chemical agents such as water. In the case of a solid state battery, a columnar structure containing crystallinity as derived from processes according to the present invention is beneficial for battery performance because it allows better Li transport through the boundaries of the material.

In the deposition system, target 12 can have an active size of about 675.7×582.48 mm by 4 to 8 mm in order to deposit films on substrate 16 that have dimension about 400×500 mm. The temperature of substrate 16 can be adjusted to between −50° C. and 500° C. The distance between target 12 and substrate 16 can be between about 3 and about 9 cm (in some embodiments, between 4.8 and 6 cm are used). Process gas can be inserted into the chamber of apparatus 10 at a rate up to about 200 sccm while the pressure in the chamber of apparatus 10 can be held at between about 0.7 and 6 milliTorr. Magnet 20 provides a magnetic field of strength between about 400 and about 600 Gauss directed in the plane of target 12 and is moved across target 12 at a rate of less than about 20-30 sec/scan. In some embodiments utilizing the AKT reactor, magnet 20 can be a race-track shaped magnet with dimensions about 150 mm by 600 mm.

Figure 1B:
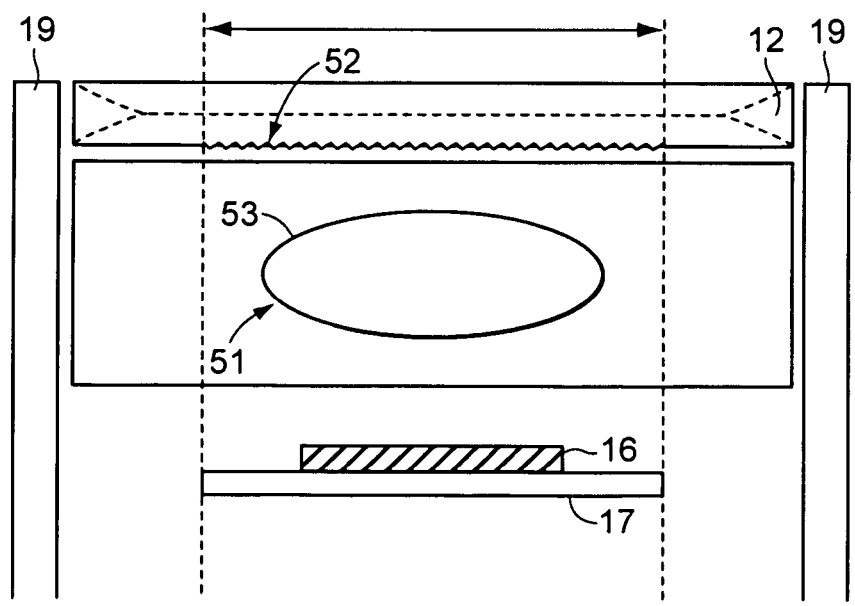
Figure 2:
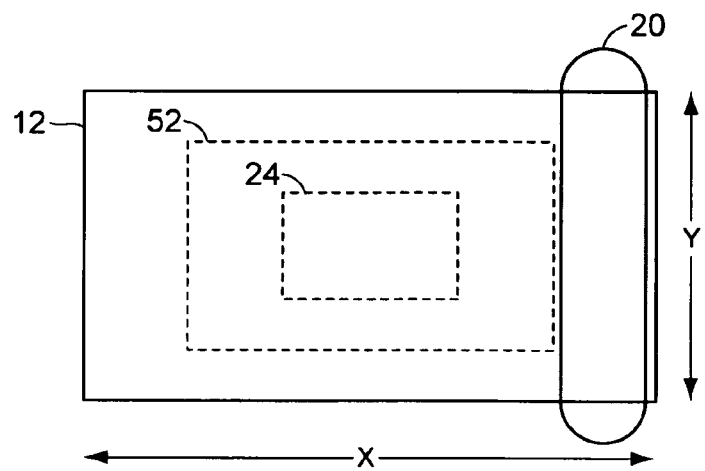
FIG. 2 shows an example of a target that can be utilized in the reactor illustrated in FIGS. 1A and 1B.

FIG. 2 illustrates an example of target 12. A film deposited on a substrate positioned on carrier sheet 17 directly opposed to region 52 of target 12 has good thickness uniformity. Region 52 is the region shown in FIG. 1B that is exposed to a uniform plasma condition. In some implementations, carrier 17 can be coextensive with region 52. Region 24 shown in FIG. 2 indicates the area below which both physically and chemically uniform deposition can be achieved, for example where physical and chemical uniformity provide refractive index uniformity, oxide film uniformity, or metallic film uniformity. FIG. 2 indicates region 52 of target 12 that provides thickness uniformity, which is, in general, larger than region 24 of target 12 providing thickness and chemical uniformity to the deposited film. In optimized processes, however, regions 52 and 24 may be coextensive.

In some embodiments, magnet 20 extends beyond area 52 in one direction, for example the Y direction in FIG. 2, so that scanning is necessary in only one direction, for example the X direction, to provide a time averaged uniform magnetic field. As shown in FIGS. 1A and 1B, magnet 20 can be scanned over the entire extent of target 12, which is larger than region 52 of uniform sputter erosion. Magnet 20 is moved in a plane parallel to the plane of target 12.

The combination of a uniform target 12 with a target area 52 larger than the area of substrate 16 can provide films of highly uniform thickness. Further, the material properties of the film deposited can be highly uniform. The conditions of sputtering at the target surface, such as the uniformity of erosion, the average temperature of the plasma at the target surface, and the equilibration of the target surface with the gas phase ambient of the process are uniform over a region which is greater than or equal to the region to be coated with a uniform film thickness. In addition, the region of uniform film thickness is greater than or equal to the region of the film which is to have highly uniform electrical, mechanical, or optical properties such as index of refraction, stoichiometry, density, transmission, or absorptivity.

Target 12 can be formed of any materials that provide the correct stoichiometry for $LiCoO_2$ deposition. Typical ceramic target materials include oxides of Li and Co as well as metallic Li and Co additions and dopants such as Ni, Si, Nb, or other suitable metal oxide additions. In the present disclosure, target 12 can be formed from $LiCoO_2$ for deposition of $LiCoO_2$ film.

In some embodiments of the invention, material tiles are formed. These tiles can be mounted on a backing plate to form a target for apparatus 10. A wide area sputter cathode target can be formed from a close packed array of smaller tiles. Target 12, therefore, may include any number of tiles, for example between 2 and 60 individual tiles. Tiles can be finished to a size so as to provide a margin of edge-wise non-contact, tile to tile, less than about 0.010" to about 0.020" or less than half a millimeter so as to eliminate plasma processes that may occur between adjacent ones of tiles 30. The distance between tiles of target 12 and the dark space anode or ground shield 19 in FIG. 1B can be somewhat larger so as to provide non contact assembly or to provide for thermal expansion tolerance during process chamber conditioning or operation.

As shown in FIG. 1B, a uniform plasma condition can be created in the region between target 12 and substrate 16 in a region overlying substrate 16. A plasma 53 can be created in region 51, which extends under the entire target 12. A central region 52 of target 12 can experience a condition of uniform sputter erosion. As discussed further herein, a layer deposited on a substrate placed anywhere below central region 52 can then be uniform in thickness and other properties (i.e., dielectric, optical index, or material concentrations). In some embodiments, target 12 is substantially planar in order to provide uniformity in the film deposited on substrate 16. In practice, planarity of target 12 can mean that all portions of the target surface in region 52 are within a few millimeters of a planar surface, and can be typically within 0.5 mm of a planar surface.

Figure 3:
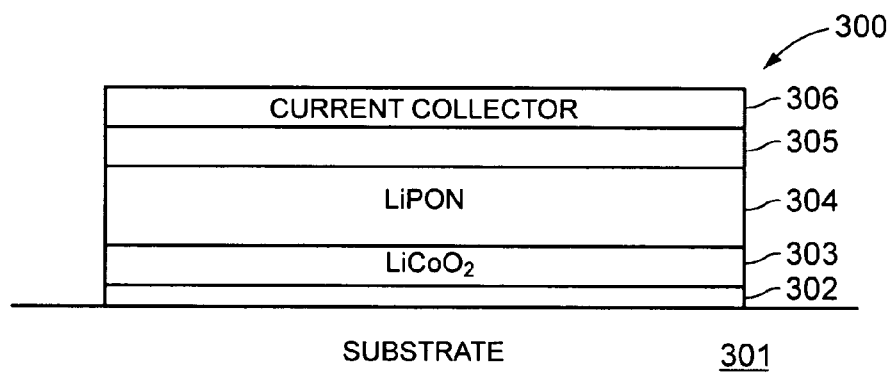
FIG. 3 illustrates a thin-film battery design according to some embodiments of the present invention.

FIG. 3 shows a battery structure with a $LiCoO_2$ layer deposited according to some embodiments of the present invention. As shown in FIG. 3, a metallic current collection layer 302 is deposited on a substrate 301. In some embodiments, current collection layer 302 can be patterned in various ways before deposition of a $LiCoO_2$ layer 303. Also according to some embodiments, $LiCoO_2$ layer 303 can be a deposited crystalline layer. In some embodiments of the invention, layer 303 is crystalline without the necessity of a crystallizing heat treatment. Therefore, substrate 301 can be a silicon wafer, titanium metal, alumina, or other conventional high temperature substrate, but may also be a low temperature material such as plastic, glass, or other material which could be susceptible to damage from the high temperature crystallizing heat treatment. This feature can have the great advantage of decreasing the expense and weight of battery structures formed by the present invention. The low temperature deposition of the $LiCoO_2$ allows for successive depositions of battery layers, one upon another. Such a process would have the advantage that successive layers of battery structure would be obtained in a stacked condition without the inclusion of a substrate layer. The stacked layered battery would provide higher specific energy density as well as low impedance operation for charging and discharging.

In some embodiments, an oxide layer can be deposited on substrate 301. For example, a silicon oxide layer can be deposited on a silicon wafer. Other layers can be formed between conducting layer 302 and substrate 301.

As further shown in FIG. 3, a LiPON layer 304 ($Li_xPO_yN_z$) is deposited over $LiCoO_2$ layer 303. LiPON layer 304 is the electrolyte for battery 300 while $LiCoO_2$ layer 303 acts as the cathode. A metallic conducting layer 305 can be deposited over the LiPON layer 304 in order to complete the battery. Metallic conducting layer 305 can include lithium adjacent to LiPON layer 304.

An anode 305 is deposited over LiPON layer 304. Anode 305 can be, for example an evaporated lithium metal. Other materials such as, for example, nickel can also be utilized. A current collector 306, which is a conducting material, is then deposited over at least a portion of anode 305.

A Li based thin film battery operates by transport of Li ions in the direction from current collector 306 to current collector 302 in order to hold the voltage between current collector 306 and current collector 302 at a constant voltage. The ability for battery structure 300 to supply steady current, then, depends on the ability of Li ions to diffuse through LiPON layer 304 and $LiCoO_2$ layer 303. Li transport through bulk cathode $LiCoO_2$ layer 303 in a thin film battery occurs by the way of grains or grain boundaries. Without being restricted in this disclosure to any particular theory of transport, it is believed that the grains with their planes parallel to substrate 302 will block the flow of Li ions while grains oriented with planes perpendicular to substrate 301 (i.e., oriented parallel to the direction of Li ion flow) facilitate the Li diffusion. Therefore, in order to provide a high-current battery structure, $LiCoO_2$ layer 303 should include crystals oriented in the <101> direction or <003> direction.

In accordance with the present invention, $LiCoO_2$ films can be deposited on substrate 302 with a pulsed-DC biased PVD system as was described above. In addition, an AKT 1600 PVD system can be modified to provide an RF bias and an Advanced Energy Pinnacle plus 10K pulsed DC power supply can be utilized to provide power to a target. The pulsing frequency of the power supply can vary from about 0 to about 350 KHz. The power output of the power supply is between 0 and about 10 kW. A target of densified $LiCoO_2$ tiles having a resistivity in the range of about 3 to about 10 kΩ can be utilized with dc-sputtering.

In some embodiments, $LiCoO_2$ films are deposited on Si wafers. Gas flows containing Oxygen and Argon can be utilized. In some embodiments, the Oxygen to Argon ratio ranges from 0 to about 50% with a total gas flow of about 80 sccm. The pulsing frequency ranges from about 200 kHz to about 300 kHz during deposition. RF bias can also be applied to the substrate. In many trials, the deposition rates vary from about 2 Angstrom/(kW sec) to about 1 Angstrom/(kW sec) depending on the $O_2$/Ar ratio as well as substrate bias.

Table I illustrates some example depositions of $LiCoO_2$ according to the present invention. XRD (x-Ray Diffraction) results taken on the resulting thin films illustrate that films deposited according to the present invention are crystalline films, often with highly textured grain sizes as large as about 150 nm. The dominant crystal orientation appears to be sensitive to the $O_2$/Ar ratio. For certain $O_2$/Ar ratios (~10%), as-deposited films exhibit a preferred orientation in the <101> direction or the <003> direction with poorly developed <003> planes.

Figure 4A:
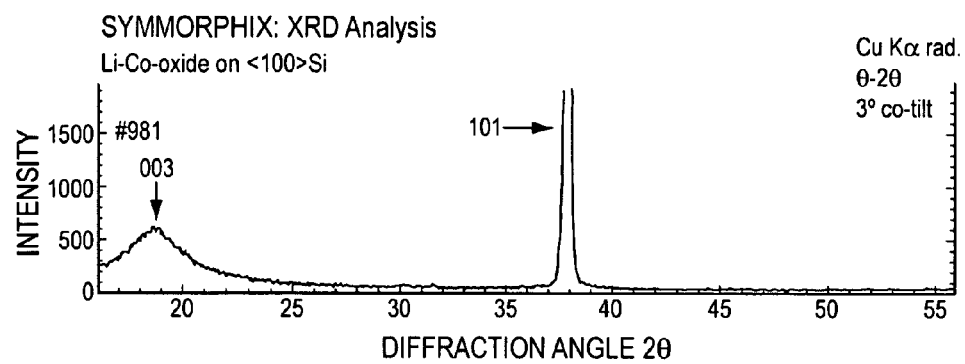
FIGS. 4A and 4B show an x-ray diffraction analysis of and an SEM photograph of a $LiCoO_2$ film deposited according to embodiments of the present invention.
Figure 4B:
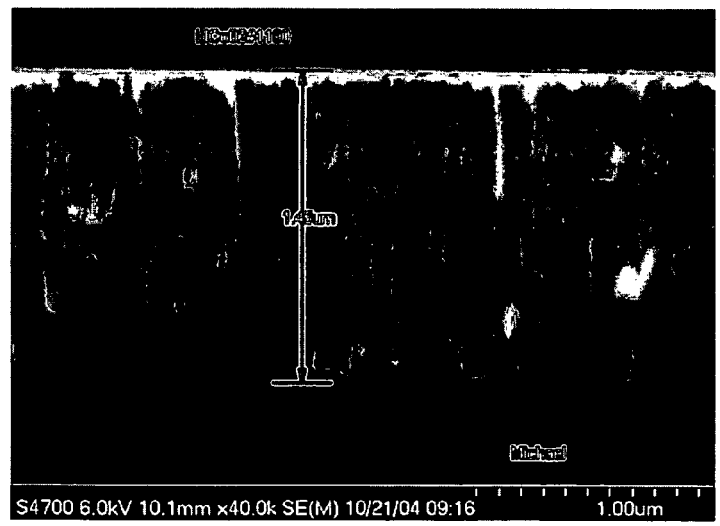

FIGS. 4A and 4B illustrate an XRD Analysis and SEM cross section, respectively, of the $LiCoO_2$ film deposited as Example 15 in Table I. Such a $LiCoO_2$ film was deposited on Si wafer with 2 kW of target power, a frequency of 300 kHz, with 60 sccm Ar and 20 sccm of $O_2$ for a substrate with an initial temperature of about 30° C. As shown in the XRD analysis of FIG. 4A, a strong <101> peak is indicated showing a strong orientation of $LiCoO_2$ crystals in the desired <101> crystallographic direction. The SEM cross section shown in FIG. 4B further shows the columnar structure of the film having the <101> direction and the grain boundaries of the resulting $LiCoO_2$ crystals.

FIGS. 5A through 5E show SEM cross sections of further example depositions of $LiCoO_2$ crystals according to the present invention. In each of the examples, deposition of the $LiCoO_2$ film was performed on a Si wafer with target power of about 2 kW and frequency of about 250 kHz. The $LiCoO_2$ film shown in FIG. 5A corresponds to the example deposition Example 1 in Table I. In the deposition of the $LiCoO_2$ film shown in FIG. 5A, no bias power was utilized with an argon flow rate of about 80 sccm and an oxygen flow rate of about 0 sccm. A deposition rate of about 1.45 µm/hr was achieved over the full substrate area of 400×500 mm. Further, as is indicated in the cross section shown in FIG. 5A, a <101> orientation of the $LiCoO_2$ was achieved.

Figure 5A:
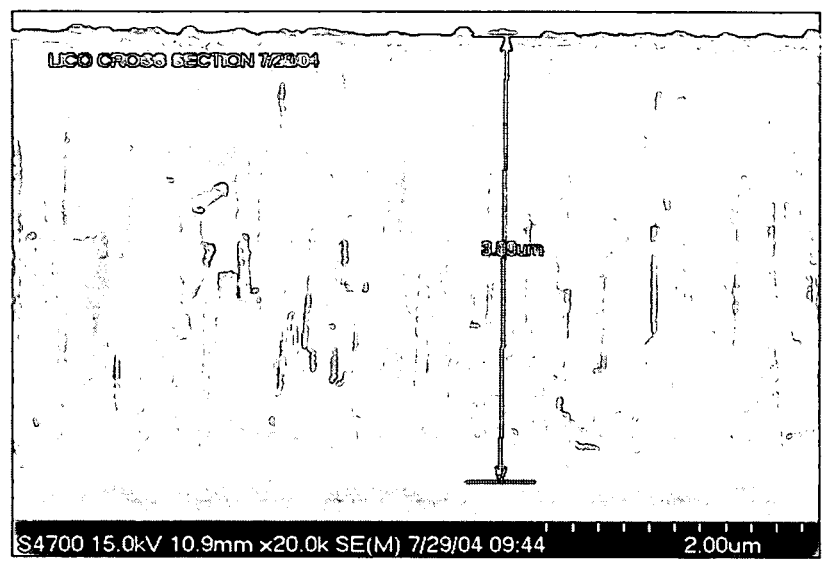
FIGS. 5A through 5E show SEM photographs of $LiCoO_2$ films according to some embodiments of the present invention.

The rate of deposition of the $LiCoO_2$ layer shown in FIG. 5A is very high, likely due to the relatively high conductivity or low resistivity of the ceramic $LiCoO_2$ oxide sputter target. A target resistance of 10 kOhms was measured by means of an Ohm meter over a distance of about 4 cm on the surface of target 12. This high rate allows the manufacture of the 3 micron or thicker $LiCoO_2$ layer required for the battery at high rate over a wide area in short times, resulting in very high productivity and very low cost. Target resistance on the order of about 500 kΩ over the same distance by the same measurement technique or higher would not allow for such a high sputter efficiency or high rate of deposition at such a low target power. The resistance of conventional target materials can be unmeasurably high. A resistance of 100 kΩ over about 4 cm of surface will result in high sputter efficiency and high rate of deposition. Further, because deposition rates typically scale nearly linearly with target power, a deposition at 6 kW will yield a deposition rate of approximately 3 µm/hr, which is a very desirable rate of deposition for manufacturability of Li-based thin-film solid-state batteries on a surface area of 400×500 $mm^2$.

Figure 5B:
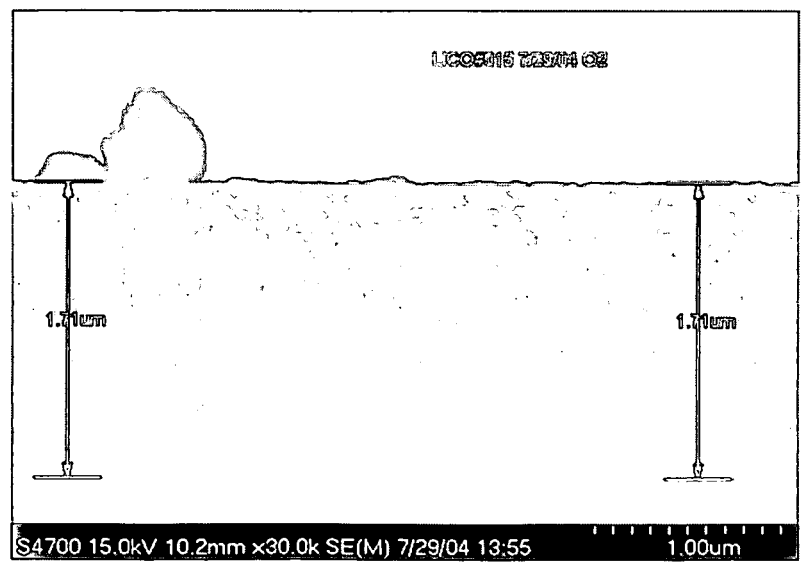

The $LiCoO_2$ layer shown in FIG. 5B is deposited under the conditions listed as Example 7 in Table I. Again, no bias was utilized in the deposition. An argon flow rate of about 72 sccm and an oxygen flow rate of about 8 sccm was utilized. The deposition rate was significantly reduced to about 0.85 µm/hr.

Further, although a <101> crystallinity can be discerned, that <101> crystallinity is not as pronounced as that exhibited in the deposition of the film shown in FIG. 5A.

Figure 5C:
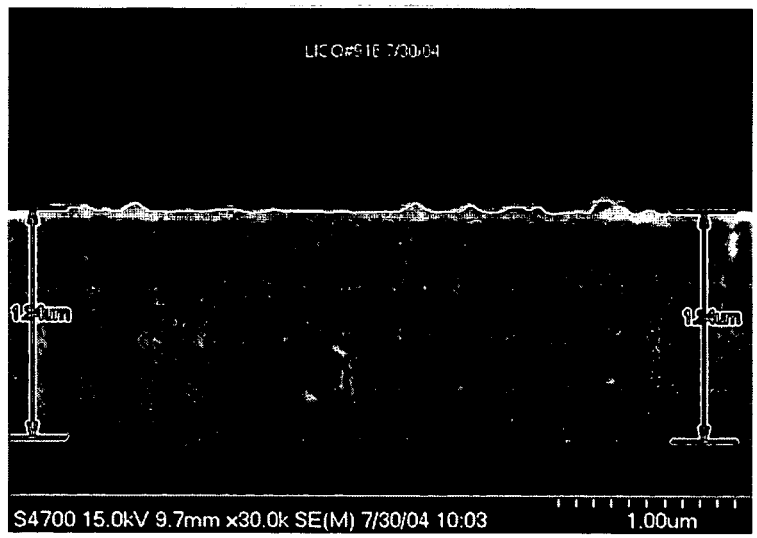

The $LiCoO_2$ film shown in FIG. 5C was deposited according to Example 3 in Table I. In this deposition, 100 W of bias power is applied to the substrate. Further, an argon flow rate of 72 sccm, and an oxygen flow rate of 8 sccm was utilized. The deposition rate was about 0.67 µm/hr. Therefore, the application of bias in comparison with the $LiCoO_2$ film shown in FIG. 5B further reduced the deposition rate (from 0.85 µm/hr of the example shown in FIG. 5B to 0.67 µm/hr of the example shown in FIG. 5C). Further, the desired <101> directionality of formed crystals appears to be further degraded.

Figure 5D:
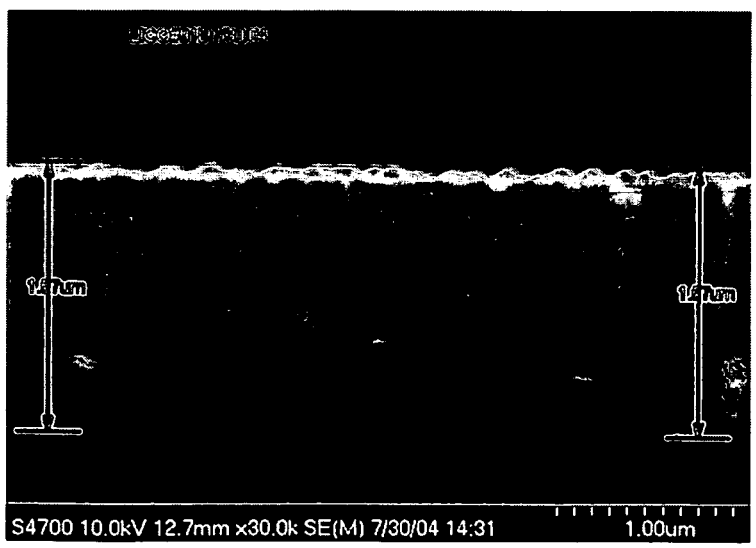

The $LiCoO_2$ film shown in FIG. 5D corresponds to Example 4 in Table I. In this deposition, the Ar/$O_2$ ratio was increased. As is shown in FIG. 5D, increasing the Ar/$O_2$ ratio improves crystallinity. With respect to the example illustrated in FIG. 5C, the deposition illustrated in FIG. 5D was performed with an argon flow of about 76 sccm and an oxygen flow of about 4 sccm as well as retaining the 100 W bias to the substrate. The $LiCoO_2$ deposition rate was improved to 0.79 µm/hr from a rate of 0.67 µm/hr illustrated in FIG. 5C.

Figure 5E:

In the example deposition illustrated in FIG. 5E corresponding to Example 5 in Table I. The substrate temperature was set at about 200° C. while the bias power remained at about 100 W. The argon flow rate was set at about 76 sccm and the oxygen flow rate was set at about 4 sccm. The resulting deposition rate for the $LiCoO_2$ layer was about 0.74 µm/hr.

In Example 6 of Table I, the argon flow rate was set at about 74 sccm and the oxygen flow rate was set at about 6 sccm, resulting in a $LiCoO_2$ deposition rate of about 0.67 µm/hr. Therefore, increasing both argon and oxygen flow rate over the deposition illustrated in FIG. 5E resulted in a lower deposition rate.

The data show clearly that an as-deposited crystalline film of $LiCoO_2$ can be obtained under several of the process conditions, as shown in Table II. In particular, very high rates of deposition with low power are obtained along with the oriented crystalline structure for the process conditions according to embodiments of the present invention.

Figure 6A:
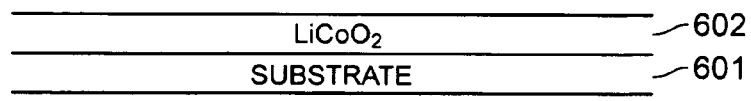
FIG. 6A illustrates a layer of $LiCoO_2$ deposited according to some embodiments of the present invention on a thin substrate.
Figure 6B:
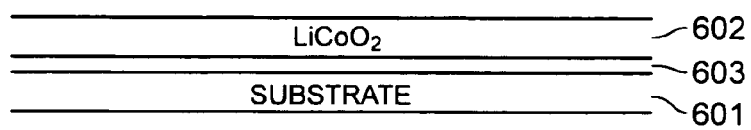
FIG. 6B illustrates a layer of $LiCoO_2$ deposited according to some embodiments of the present invention over a conducting layer on a thin substrate.

FIG. 6A illustrates a layer of $LiCoO_2$ 602 deposited on a thin substrate 601 according to some embodiments of the present invention. Higher lithium-ion mobilities can be achieved utilizing crystalline $LiCoO_2$ cathode films 602 deposited on a thin substrate 601 that has thickness comparable to that of the battery stack itself, rather than a thickness many or tens of times that of the battery stack. Such a film can lead to faster charging and discharging rates. Substrate 601 can be formed of a thin metallic sheet (e.g., aluminum, titanium, stainless steel, or other suitable thin metallic sheet), can be formed of a polymer or plastic material, or may be formed of a ceramic or glass material. As shown in FIG. 6B, if substrate 601 is an insulating material, a conducting layer 603 can be deposited between substrate 601 and $LiCoO_2$ layer 602.

Figure 7A:
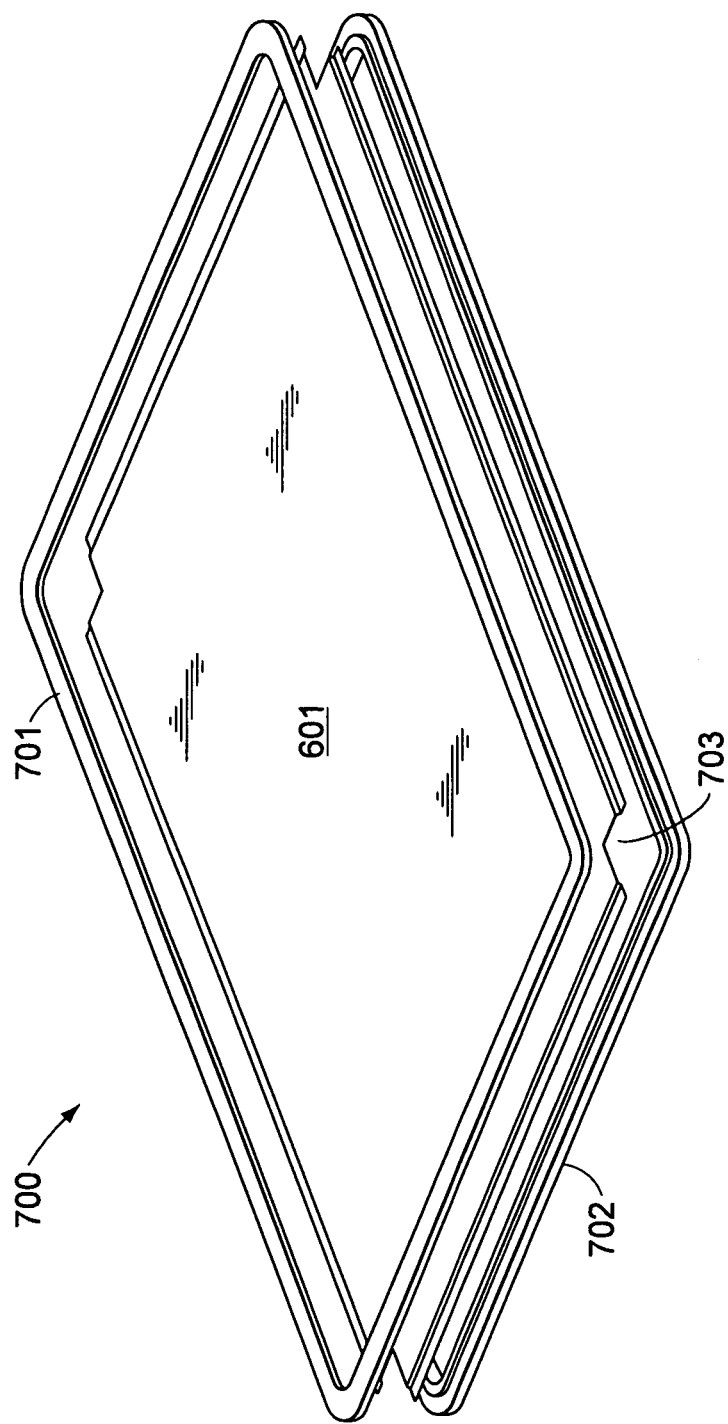
FIGS. 7A, 7B, 7C, and 7D illustrate a thin substrate mount and mask arrangement that can be utilized in the deposition of $LiCoO_2$ layers deposited according to some embodiments of the present invention.
Figure 7B:
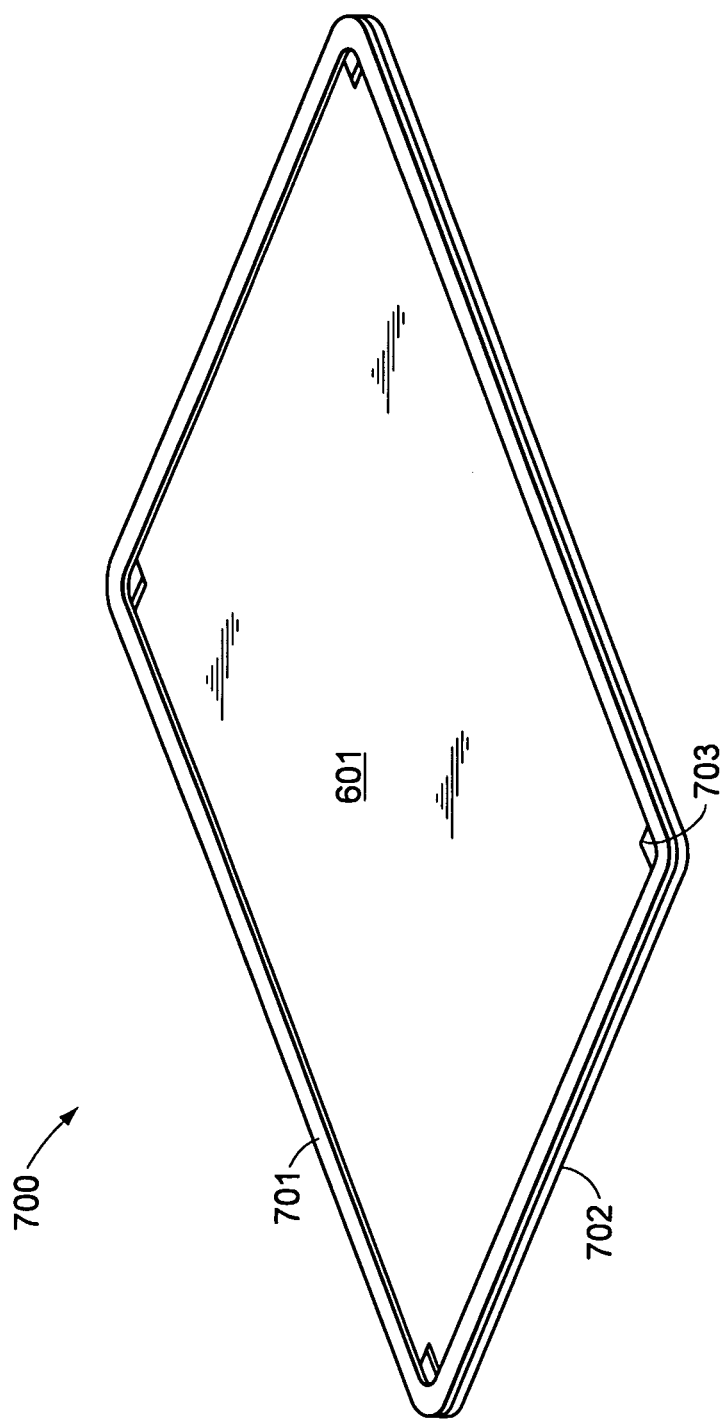

Depositing materials on a thin substrate involves holding and positioning the substrate during deposition. FIGS. 7A, 7B, 7C, and 7D illustrate a reusable fixture 700 for holding a thin film substrate. As shown in FIG. 7A, reusable fixture 700 includes a top portion 701 and a bottom portion 702 that snap together. Thin substrate 601 is positioned between top portion 701 and bottom portion 702. As shown in FIG. 7B, top portion 701 and bottom portion 702 are such that substrate 601 is brought into tension and subsequently clamped as top portion 701 is closed into bottom portion 702. Substrate 601 can be easily held by fixture 700 so that substrate 601 can be handled and positioned. In some embodiments, the corners of substrate 601, areas 703, are removed so that substrate 601 is more easily stretched by avoiding "wrap-around" corner clamping effects when top portion 701 is closed into bottom portion 702.

Figure 7C:
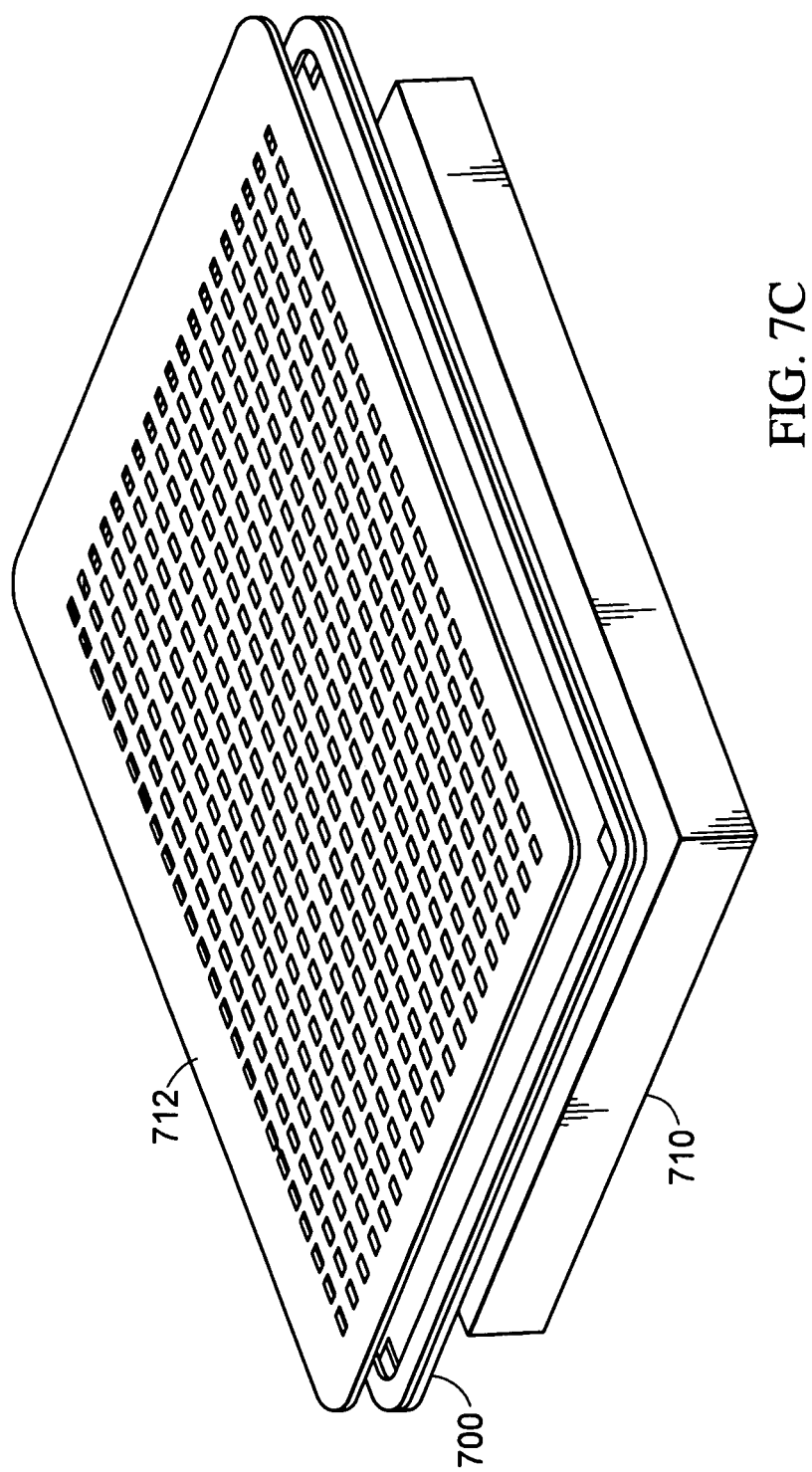

As shown in FIG. 7C, a mask 712 can be attached to fixture 700. In some embodiments, fixture 700 includes guides in order to align fixture 700 with respect to mask 712.

In some embodiments, mask 712 may be attached to fixture 700 and travel with fixture 700. Mask 712 can be positioned at any desired height above substrate 601 in fixture 700. Therefore, mask 712 can function as either a contact or proximity mask. In some embodiments, mask 712 is formed of another thin substrate mounted in a fixture similar to fixture 700.

Figure 7D:
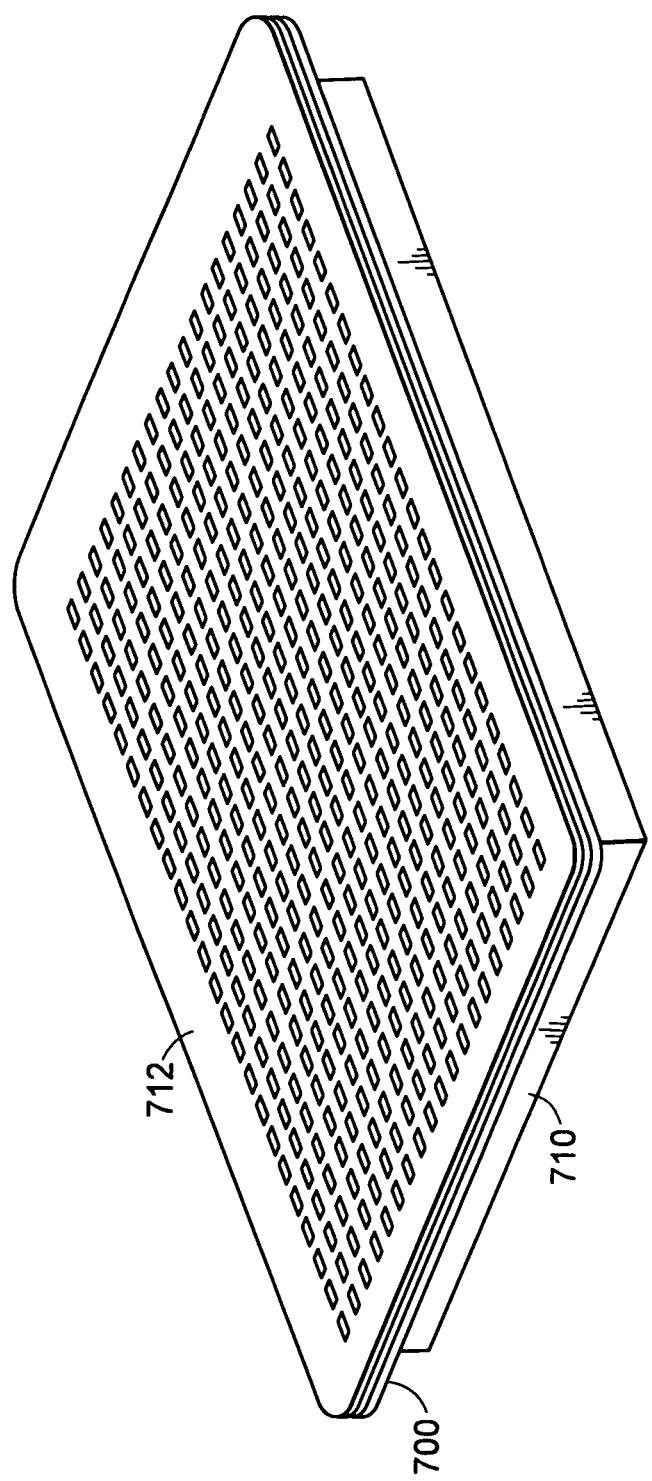

As shown in FIGS. 7C and 7D, fixture 700 and mask 712 can be positioned relative to mount 710. Mount 710, for example, can be a susceptor, mount, or an electrostatic chuck of a processing chamber such as that shown in FIGS. 1A and 1B. Fixture 700 and mask 712 can have features that allow for ready alignment with respect to each other and with respect to mount 710. In some embodiments, mask 712 is resident in the processing chamber and aligned with fixture 700 during positioning of fixture 700 on mount 710, as shown in FIG. 7D.

Utilizing fixture 700 as shown in FIGS. 7A, 7B, 7C, and 7D allows processing of a thin film substrate in a processing chamber. In some embodiments, thin film substrates can be about 10 μm or more. Further, thin film substrate 601, once mounted within fixture 700, can be handled and moved from process chamber to process chamber. Therefore, a multiprocessor chamber system can be utilized to form stacks of layers, including one or more layers of $LiCoO_2$ deposited according to embodiments of the present invention.

Figure 8:
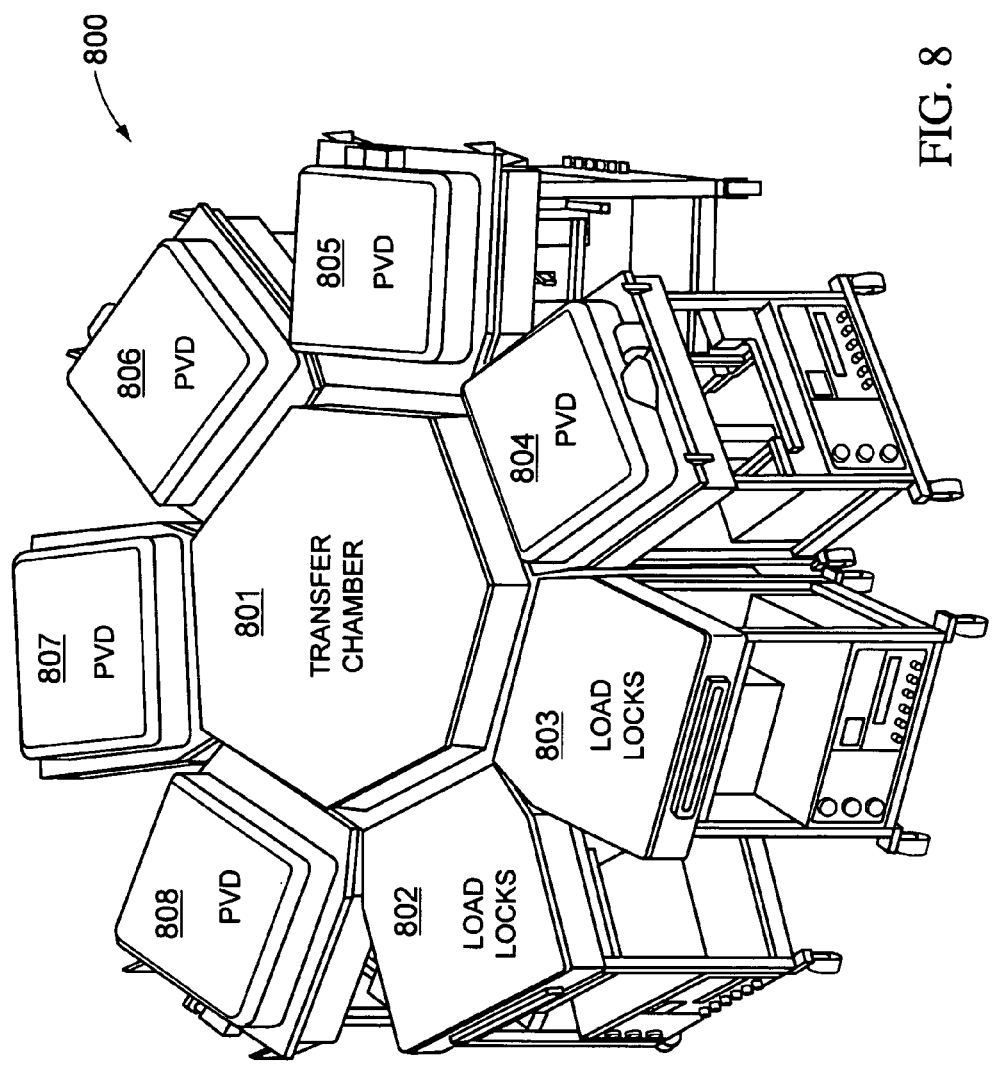
FIG. 8 illustrates a cluster tool that can be utilized to form batteries with $LiCoO_2$ layers deposited according to some embodiments of the present invention.

FIG. 8 illustrates a cluster tool 800 for processing thin film substrates. Cluster tool 800 can, for example, include load lock 802 and load lock 803, through which mounted thin film substrate 601 is loaded and a resultant device is removed from cluster tool 800. Chambers 804, 805, 806, 807, and 808 are processing chambers for depositions of materials, heat treatments, etching, or other processes. One or more of chambers 804, 805, 806, 807, and 808 can be a pulsed-DC PVD chamber such as that discussed above with respect to FIGS. 1A and 1B and within which a $LiCoO_2$ film deposited according to embodiments of the present invention may be deposited.

Processing chambers 804, 805, 806, 807, and 808 as well as load locks 802 and 803 are coupled by transfer chamber 801. Transfer chamber 801 includes substrate transfer robotics to shuttle individual wafers between processing chambers 804, 805, 806, 807, and 808 and load locks 802 and 803.

In production of a conventional thin-film battery, ceramic substrates are loaded into load lock 803. A thin metallic layer can be deposited in chamber 804, followed by a $LiCoO_2$ deposition performed in chamber 805. The substrate is then removed through load lock 803 for an in-air heat treatment external to cluster tool 800. The treated wafer is then reloaded into cluster tool 800 through load lock 802. A LiPON layer can be deposited in chamber 806. The wafer is then again removed from cluster tool 800 for deposition of the lithium anode layer, or sometimes chamber 807 can be adapted to deposition of the lithium anode layer. A second metallic layer is deposited in chamber 808 to form a charge collector and anode collector. The finished battery structure is then offloaded from cluster tool 800 in load lock 802. Wafers are shuttled from chamber to chamber by robotics in transfer chamber 801.

A battery structure produced according to the present invention could utilize thin film substrates loaded in a fixture such as fixture 700. Fixture 700 is then loaded into load lock 803. Chamber 804 may still include deposition of a conducting layer. Chamber 805 then includes deposition of a $LiCoO_2$ layer according to embodiments of the present invention. A LiPON layer can then be deposited in chamber 806. Chamber 807 may still be adapted to deposition of a lithium rich material such as lithium metal and chamber 808 can be utilized for deposition of the conducting layer of the current collector. In this process, no heat treatment is utilized to crystallize the $LiCoO_2$ layer.

Another advantage of a thin film battery process is the ability to stack battery structures. In other words, substrates loaded into cluster tool 800 may traverse process chambers 804, 805, 806, 807, and 808 multiple times in order to produce multiply stacked battery structures. FIGS. 9A and 9B illustrate such battery structures.

FIG. 9A illustrates a parallel coupled stacking. As shown in FIG. 9A, a substrate 601, which for example can be a plastic substrate, is loaded into load lock 803. A conducting layer 603, for example about 2 μm of aluminum, copper, iridium or other material, acts as a bottom current collector. Conducting layer 603, for example, can be deposited in chamber 804. A $LiCoO_2$ layer 602 is then deposited on conducting layer 603. $LiCoO_2$ layer 602 can be about 3-10 μm and can be deposited in chamber 805 according to embodiments of the present invention. The wafer can then be moved to chamber 806 where a LiPON layer 901 of thickness of about 0.5 to about 2 μm can be deposited. In chamber 807, an anode layer 902, for example a lithium metal layer of up to about 10 μm, can then be deposited in chamber 807. A second conducting layer 903 can then be deposited over anode layer 902. A second battery stack can then be deposited over the first battery stack formed by metal layer 603, LiCoO2 layer 602, LiPON layer 901, lithium layer 902, and current collection conduction layer 903. Over current collection conducting layer 903, another lithium layer 902 is formed. Another LiPON layer 901 is formed over lithium layer 902. Another LiCoO2 layer 602 is formed over LiPON layer 901 and finally another metal layer 603 is formed over LiCoO2 layer 602. In some embodiments, further stackings can be formed. In some embodiments, metal layers 603 and 903 differ in the mask utilized in deposition so that tabs are formed for electrical coupling of layers.

As discussed above, any number of individual battery stacks can be formed such that parallel battery formations are formed. Such a parallel arrangement of battery stacking structure can be indicated as Current collector/LiCoO2/LiPON/Anode/current collector/Anode/LiPON/LiCoO2/current collector/LiCoO2 . . . /current collector. FIG. 9B illustrates an alternative stacking corresponding to the battery structure current collector/LiCoO2/LiPON/anode/current collector/LiCoO2/LiPON/anode/current collector . . . /current collector. In this case, a series arrangement battery stacking structure is formed because the individual battery stacks share anodes.

To form the structures shown in FIGS. 9A and 9B, substrates are rotated again through the chambers of cluster tool 800 in order to deposit the multiple sets of batteries. In general, a stack of any number of batteries can be deposited in this fashion.

In some embodiments, stoichiometric $LiCoO_2$ can be deposited on iridium. FIGS. 10A through 10D illustrate an anneal procedure for Li—Co deposition over an iridium layer that has been deposited on a Si wafer. The $LiCoO_2$ deposition was accomplished as discussed above with a target power of 2 kW, no bias power, reverse time of 1.6 μs, a pulsing frequency of 300 kHz, with 60 sccm Ar flow and 20 sccm of $O_2$ flow, with no pre-heat for 7200 sec. As a result, a layer of $LiCoO_2$ of about 1.51 μm was deposited.

FIGS. 10A through 10D show XRD analysis of both as-deposited and annealed layers of LiCoO$_2$ deposited as discussed above. The XRD analysis of the as-deposited layer demonstrates a shallow peak at 2θ=18.85° denoting a <003> orientation of crystalline LiCoO$_2$, a sharper peak at about 2θ=38.07° corresponding with the desired <101> crystallographic direction, and a peak at 2θ=40.57° corresponding to the <111> direction of iridium. However, the position of the <101> LiCoO$_2$ peak indicates that the <101> LiCoO$_2$ peak is nonstoichiometric LiCoO$_2$. In order to be useful as a battery layer, stoichiometric LiCoO$_2$ provides for the best Li transport. One of ordinary skill in the art will notice that careful adjustment of deposition parameters can provide stoichiometric LiCoO$_2$ of desired orientation.

FIG. 10B shows an XRD analysis of the sample shown in FIG. 10A after a 300° C. anneal in air for 2 hours. As shown in FIG. 10B, the XRD peak corresponding to <003> LiCoO$_2$ grows, indicating crystallization of LiCoO$_2$ into the <003> direction. Further, the <101> peak of LiCoO$_2$ shifts slightly to 2θ=38.53°, indicating a more stoichiometric crystallization of the <101> LiCoO$_2$. However, the crystalline LiCoO$_2$ is still not stoichiometric after this anneal. One of ordinary skill in the art will notice that longer anneals and/or further adjustment of the deposited stoichiometry may result in usefully oriented stoichiometric LiCoO$_2$ layers with anneal temperatures at 300° C. or less. Consequently, low temperature materials such as polymers, glass, or metal may be utilized as the substrate.

FIG. 10C illustrates an XRD analysis from the sample after a subsequent 500° C. anneal in air for 2 hours. As shown in FIG. 10C, more of the LiCoO$_2$ crystallizes into the <003> layer. Further, the <101> LiCoO$_2$ peak shifts again to 2θ=39.08°, indicating crystallization of a <012> layer of LiCoO$_2$. In this case, the <012> LiCoO$_2$ crystal is stoichiometric and therefore allows for efficient Li transport. One of ordinary skill in the art will notice that longer anneals and/or further adjustment of the deposited stoichiometry may result in usefully oriented stoichiometric LiCoO$_2$ layers with anneal temperatures at 500° C. or less. Consequently, low temperature materials such as polymers, glass, or metal may be utilized as the substrate.

FIG. 10D illustrates an XRD analysis of the sample after a subsequent anneal of 700° C. in air for 2 hours. As shown in FIG. 10D, the <003> LiCoO$_2$ peak disappears, but the <012> LiCoO$_2$ peak remains relatively the same as that shown in the 500° anneal illustrated in FIG. 10C.

FIGS. 10A through 10D demonstrate deposition of <101> LiCoO$_2$ at low temperature over an iridium layer. Subsequent anneals to 500° C. may be desired to change the stoichiometry of the <101> LiCoO$_2$ layer, but anneals to 700° C. do not appear to be necessary. With anneal temperatures less than 500° C., depositions of a LiCoO$_2$ layer over a conducting iridium layer can be accomplished on glass, aluminum foil, plastic, or other low temperature substrate material. Anneal temperatures of less than 500° C. but greater than 300° C. or lengthening the time of lower temperature anneals may also result in desired orientations of stoichiometric crystalline LiCoO$_2$.

Figure 11A:
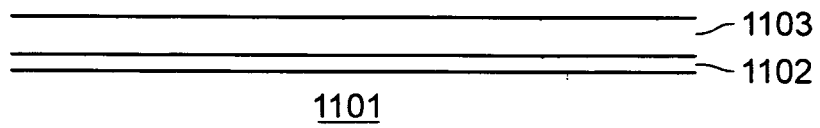
FIGS. 11A through 11D illustrate a single layer battery formed over an iridium layer according to some embodiments of the present invention.

FIGS. 11A through 11D illustrate formation of a single-layer battery according to some embodiments of the present invention. As shown in FIG. 11A, a lift-off layer 1102 can be deposited on a substrate 1101. Further, an iridium layer 1103 can be deposited over lift-off layer 1102. In some embodiments, substrate 1101 can be plastic, glass, Al foil, Si wafer, or any other material. Lift-off layer 1102 can be any lift off layer and can be a polymer layer such as polyimide, an inorganic layer such as CaF$_2$ or carbon, or an adhesive layer that loses its adhesion as a result of, for example, oxidation, heat, or light. Lift-off layers are well known. Iridium layer 1103 can be from about 500 Å or more.

Figure 11B:
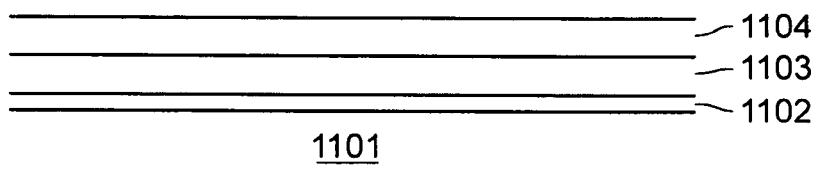

As shown in FIG. 11B, a LiCoO$_2$ layer is deposited over iridium layer 1103 as was discussed above. In some embodiments, an anneal can be performed at this step. In some embodiments, further layers of the battery may be deposited before an anneal step is performed. In some embodiments, a stoichiometric LiCoO$_2$ layer of a useful crystalline orientation may result in the as-deposited LiCoO$_2$ with no further anneals necessary.

Figure 11C:
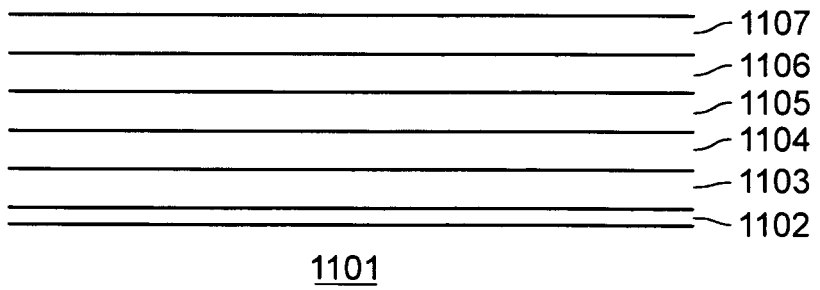

FIG. 11C illustrates deposition of a LiPON layer 1105 over the LiCoO$_2$ layer, deposition of a Li layer 1106 over LiPON layer 1105, and deposition of an electrode layer 1107 over Li layer 1106. In some embodiments, an anneal step of up to 500° C. as discussed above may be performed here.

Figure 11D:
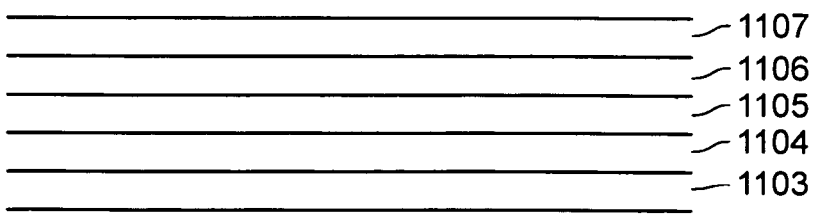

As shown in FIG. 11D, the resulting single-layer battery formed from iridium layer 1103, LiCoO$_2$ layer 1104, LiPON layer 1105, Li layer 1106, and electrode layer 1107 can be "lifted off" from substrate 1101. Such a single-layer battery can be a free-standing battery of thickness about 5 μm or greater. Such a battery, without the requirement of a substrate 1101, is well known to have the potential of energy storage of greater than about 1 kW-hr/liter.

As an alternative to a lift-off process as described in FIGS. 11A through 11D, a substrate may be removed during anneal leaving a single-layer battery. Further, in some embodiments, substrate 1101 can be removed by a solvent, etching, or a photo process. Further, single-layer batteries may be combined or stacked in any fashion to provide a device of greater energy storage at a particular voltage.

Figure 12:
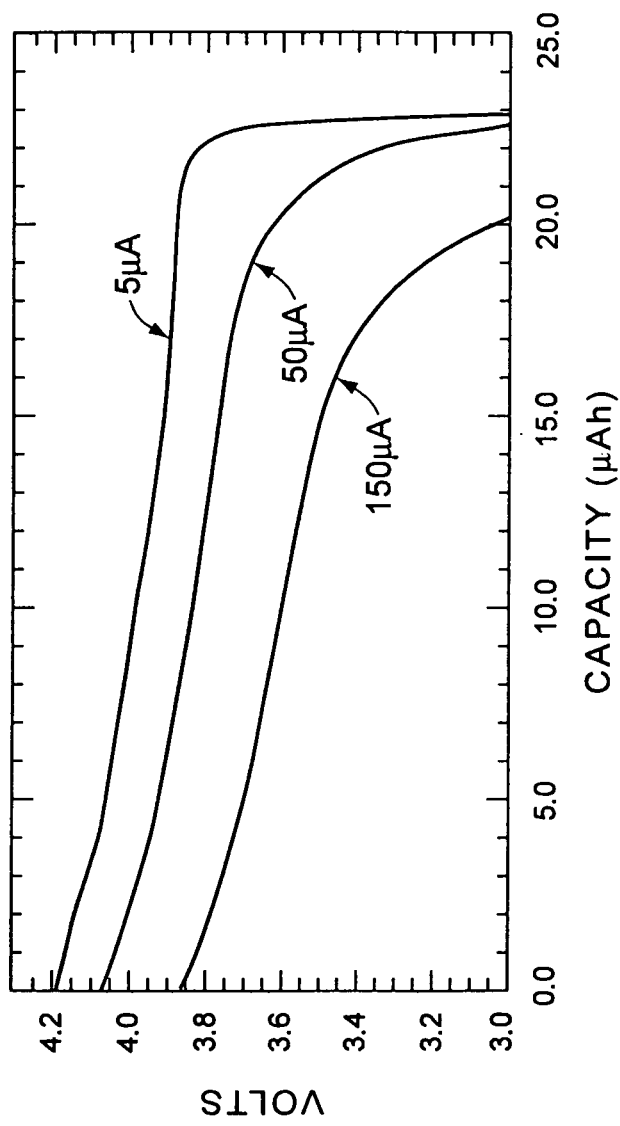
FIG. 12 illustrates battery performance utilizing films deposited according to some embodiments of the present invention.

FIG. 12 illustrates performance of a battery structure such as that shown in FIGS. 9A and 9B with a LiCoO$_2$ film deposited according to the present invention. The film was annealed at 700 C for a 2 hour period and characterized by Oakridge Microenergy, Inc., of Oakridge, Tenn.

One skilled in the art will recognize variations and modifications of the examples specifically discussed in this disclosure. These variations and modifications are intended to be within the scope and spirit of this disclosure. As such, the scope is limited only by the following claims.

TABLE I

| Example # | Target Power (kW) | Bias Power (W) | Reverse Time (μs) | Frequency (kHz) | Ar (sccm) | O$_2$ (sccm) | Initial Substrate Temperature (temperature during deposit) (° C.) | Deposition Time (sec) | Film Thickness (μm) |
|---|---|---|---|---|---|---|---|---|---|
| 1 | 2 | 0 | 1.6 | 250 | 80 | 0 | 30 | 10000 | 3.9 |
| 2 | 2 | 0 |  | 250 | 72 | 8 | 30 | 7200 | 1.7 |
| 3 | 2 | 100 |  | 250 | 72 | 8 | 30 | 7200 | 1.34 |

TABLE I-continued

| Example # | Target Power (kW) | Bias Power (W) | Reverse Time (μs) | Frequency (kHz) | Ar (sccm) | O₂ (sccm) | Initial Substrate Temperature (temperature during deposit) (° C.) | Deposition Time (sec) | Film Thickness (μm) |
|---|---|---|---|---|---|---|---|---|---|
| 4 | 2 | 100 | | 250 | 76 | 4 | 30 | 7200 | 1.57 |
| 5 | 2 | 100 | | 250 | 76 | 4 | 200 | 7200 | 1.3 |
| 6 | 2 | 100 | | 250 | 74 | 6 | 200 | 7200 | 1.3 |
| 7 | 2 | 0 | | 300 | 72 | 8 | 30 | 7200 | 1.58 |
| 8 | 2 | 0 | | 300 | 74 | 6 | 30 | 7200 | |
| 9 | 2 | 100 | | 300 | 74 | 6 | 30 | 7200 | |
| 10 | 2 | 100 | | 300 | 72 | 8 | 30 | 7200 | |
| 11 | 2 | 100 | | 300 | 70 | 10 | 30 | 7200 | |
| 12 | 2 | 0 | | 300 | 70 | 10 | 30 | 7200 | |
| 13 | 2 | 0 | | 300 | 72 | 8 | 30 | 7200 | 1.58 |
| 14 | 2 | 0 | | 300 | 74 | 6 | 30 | 7200 | |
| 15 | 2 | 0 | | 300 | 60 | 20 | 30 | 7200 | |
| 16 | 2 | 0 | | 300 | 50 | 30 | 30 | 7200 | |
| 17 | 2 | 200 | | 300 | 60 | 20 | 30 | 7200 | |
| 18 | 2 | 50 | | 300 | 60 | 20 | 30 | 7200 | |
| 19 | 2 | 0 | | 300 | 70 | 10 | 30 | 7200 | |
| 20 | 2 | 0 | | 300 | 65 | 15 | 30 | 7200 | |
| 21 | 3 | 0 | | 300 | 65 | 15 | 30 | 7200 | |
| 22 | 2 | 0 | 1.6 | 250 | 60 | 20 | 30 | 7200 | |
| 23 | 3 | 0 | 1.6 | 250 | 60 | 20 | 30 | 7200 | |
| 24 | 2 | 0 | 1.6 | 250 | 60 | 20 | 30 (NPH) | 7200 | |
| 25 | 2 | 0 | 1.6 | 250 | 60 | 20 | 10 min heat 30 min coc | 7200 | |
| 26 | 2 | 0 | 1.6 | 250 | 60 | 20 | no preheat | 9000 | |
| 27 | 2 | 0 | | 300 | 60 | 20 | no preheat | 7200 | |
| 28 | 2 | 0 | | 300 | 60 | 20 | 15 min heat, 10 min | 7200 | |
| 29 | 2 | 0 | | 250 | 60 | 20 | no preheat | | |
| 30 | 2 | 0 | | 250 | 60 | 20 | 10 min, 10 min | | |

TABLE II

| Example # | Phase | Lattice | Texture | $d_{101}$ [Å] | $2\theta$ [°] | crystallite size [Å] |
|---|---|---|---|---|---|---|
| 15 | LiCoO₂ | rhombohedral | strong [101] | 2.376(1) | 37.83 | ~1300 |
| 16 | LiCoO₂ | Rhombohedral | strong [101] | 2.375(1) | 37.85 | ~750 |
| 17 | Co | cubic | random | — | — | <50 |
| 18 | Co | cubic | random | — | — | <50 |
| 19 | LiCoO₂ | rhombohedral | strong [101] | 2.370(1) | 37.93 | ~1400 |
| 20 | LiCoO₂ | rhombohedral | strong [101] | 2.372(1) | 37.90 | ~1500 |
| 21 | LiCoO₂ | rhombohedral | strong [101] | 2.370(1) | 37.92 | ~1700 |
| PDF | LiCoO₂ | Rhombohedral | random | 2.408(1) | 37.31 | — |

What is claimed is:

1. A method of depositing a LiCoO₂ layer, comprising:
   placing a substrate in a reactor;
   flowing a gaseous mixture including argon and oxygen through the reactor;
   applying pulsed DC power to a densified conductive ceramic LiCoO₂ sputter target having a resistivity of about 3 kΩ-10 kΩ, the densified conductive ceramic LiCoO₂ sputter target being positioned opposite the substrate, wherein the conductive ceramic LiCoO₂ sputter target comprises Li and Co oxides, Li and Co metallic additions, and at least one dopant of Ni, Si, or Nb;
   applying an RF bias power to the substrate; and
   filtering the RF bias power with a narrow-band rejection filter from coupling into the pulsed DC power,
   wherein a crystalline layer of LiCoO₂ having a columnar structure is deposited over the substrate.

2. The method of claim 1, wherein the crystalline layer is <101> oriented.

3. The method of claim 1, wherein the crystalline layer is <003> oriented.

4. The method of claim 1, wherein a grain size of the crystalline layer is between about 750 Å and about 1700 Å.

5. The method of claim 1 wherein the substrate is a material chosen from a set comprised of silicon, polymers, glasses, ceramics, and metals.

6. The method of claim 1, further including preheating the substrate to a temperature of about 200° C.

7. The method of claim 1, wherein the substrate is a low temperature substrate.

8. The method of claim 7, wherein the low temperature substrate is one of a set of substrates including glass, plastic, and metal foil.

9. The method of claim 1, further including forming an oxide layer on the substrate.

10. The method of claim 9, wherein the oxide layer is a silicon dioxide layer.

11. The method of claim 2, wherein the crystalline layer is deposited at a rate of greater than about 1 µm per hour.

12. The method of claim 1, further including depositing a metal layer on the substrate.

13. The method of claim 12, wherein the metal layer is iridium.

14. The method of claim 1, further including annealing the crystalline layer with a low thermal budget.

15. The method of claim 12, further including annealing the $LiCoO_2$ layer at a temperature of less than or equal to about 500° C.

16. The method of claim 12, further including annealing the $LiCoO_2$ layer at a temperature of less than or equal to about 400° C.

17. The method of claim 1, wherein the thickness uniformity of the crystalline layer of $LiCoO_2$ has a standard deviation of 3% one-sigma.

* * * * *